United States Patent [19]
Iwamoto et al.

[11] Patent Number: 5,946,266
[45] Date of Patent: Aug. 31, 1999

[54] SYNCHRONOUS SEMICONDUCTOR MEMORY DEVICE CAPABLE OF REDUCING DELAY TIME AT DATA INPUT/OUTPUT LINE UPON DATA INPUT

[75] Inventors: Hisashi Iwamoto; Yasuhiro Konishi, both of Hyogo, Japan

[73] Assignee: Mitsubishi Denki Kabushiki Kaisha, Tokyo, Japan

[21] Appl. No.: 08/946,650

[22] Filed: Oct. 7, 1997

Related U.S. Application Data

[63] Continuation of application No. 08/717,586, Sep. 20, 1996, abandoned.

[30] Foreign Application Priority Data

Jan. 16, 1996 [JP] Japan .................................. 8-004784

[51] Int. Cl.$^6$ .................................................. G11C 8/00
[52] U.S. Cl. ................................. 365/233; 365/230.03
[58] Field of Search ................................ 365/233, 233.5, 365/238.5, 239, 230.03, 236

[56] References Cited

U.S. PATENT DOCUMENTS 5,404,338  4/1995  Murai et al. .
5,485,426  1/1996  Lee et al. .
5,592,434  1/1997  Iwamoto et al. ........................ 365/233

OTHER PUBLICATIONS

"16Mbit Synchronous DRAM with 125Mbyte/sec Data Rate", Choi et al., 1993 Symposium on VLSI Circuits, pp. 65–66.

"A 150–MHz 4–Bank 64M–bit SDRAM with Address . . . ", Kodama et al., 1994 Symposium on VLSI Circuits Digest of Technical Papers, pp. 81–82.

"A 180MHz Multiple–registered DRAM for low–cost . . . ", Iwamoto et al., IEEE 1994 Custom Integrated Circuits Conference, pp. 591–594.

*Primary Examiner*—David Nelms
*Assistant Examiner*—Hoai V. Ho
*Attorney, Agent, or Firm*—McDermott, Will & Emery

[57] ABSTRACT

In a synchronous dynamic random access memory (SDRAM), one bank A is divided into banks A0 and A1, and two sets of writing-related circuits are arranged corresponding to each memory cell array bank and are capable of performing writing operation substantially independently. The first and second bits of write data applied successively from the outside world are applied alternately to write registers. Since the I/O line pair is connected to the selected memory cells in respective memory cell array banks after incorporation of the second bit data to be written is completed, the potential levels of the corresponding I/O line pair always change to the corresponding potential levels from the initial state in writing the first and second bit data.

21 Claims, 26 Drawing Sheets

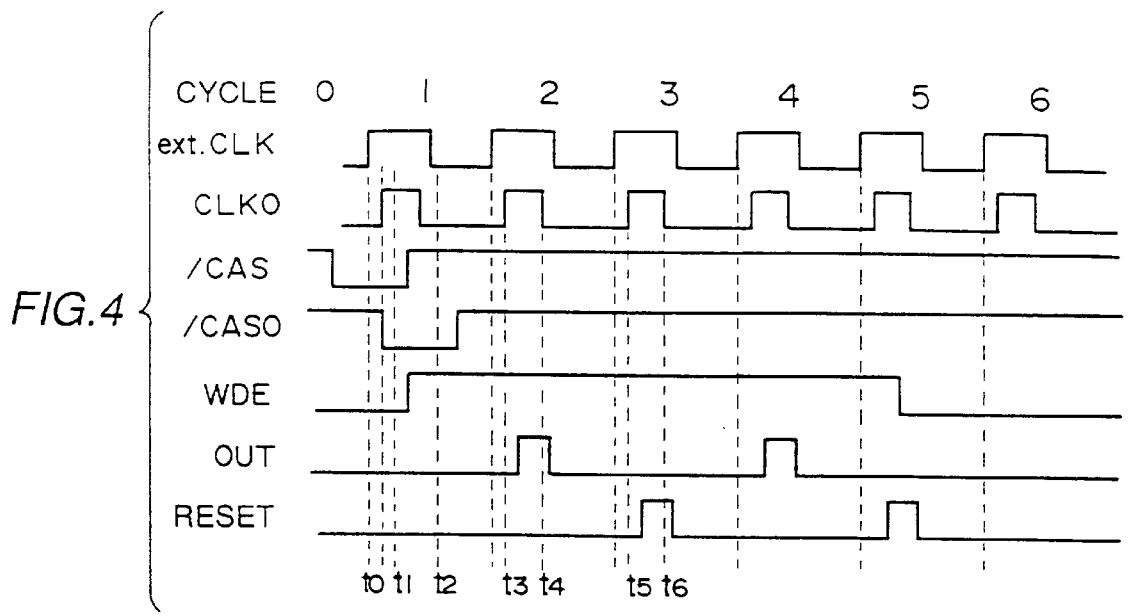
FIG.4
FIG.5
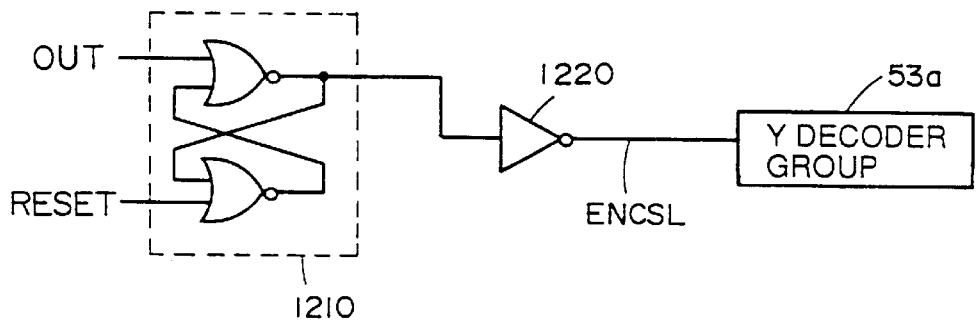
FIG.6
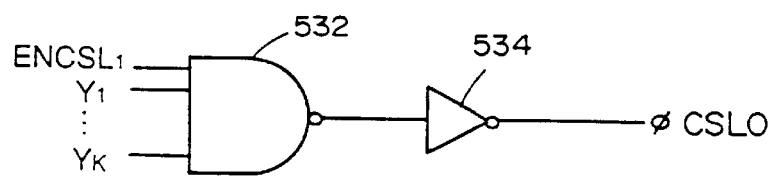
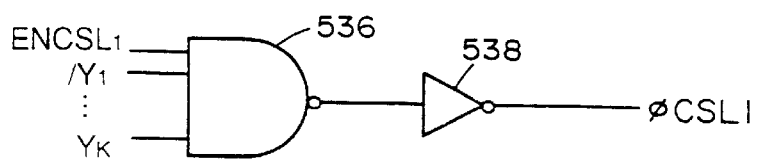

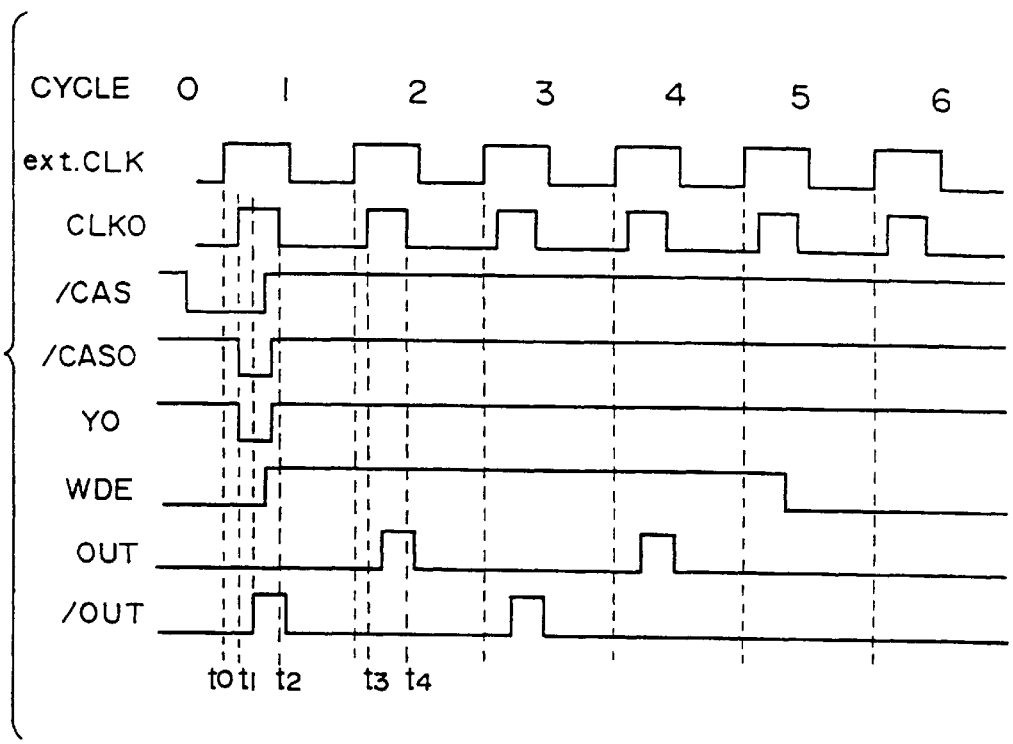
FIG. 14
FIG. 15
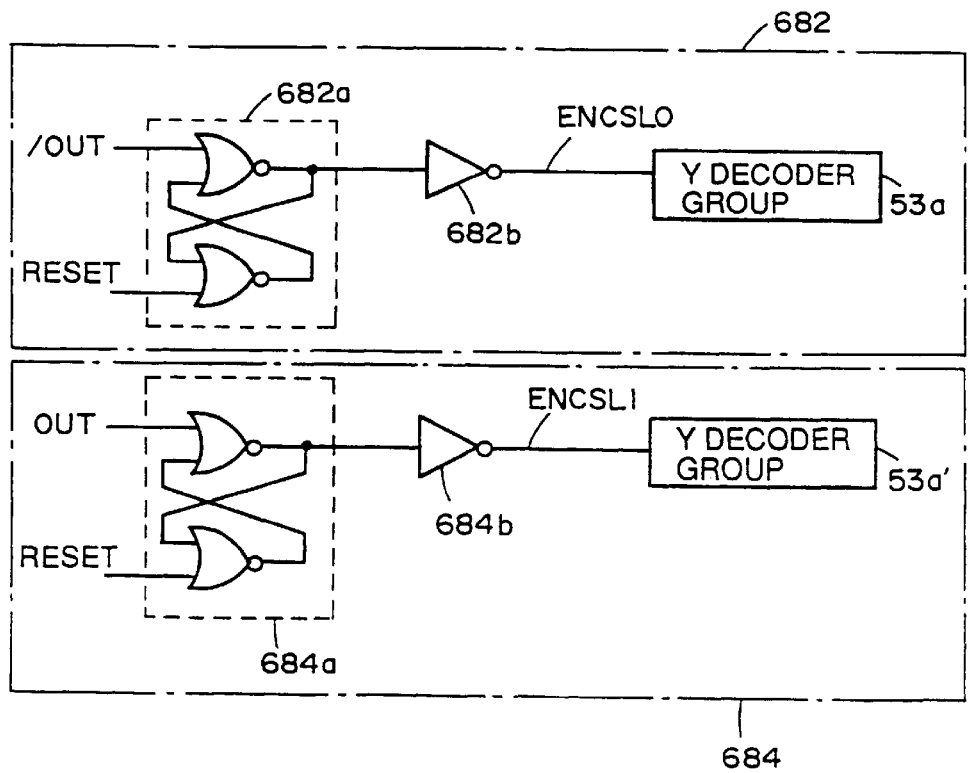

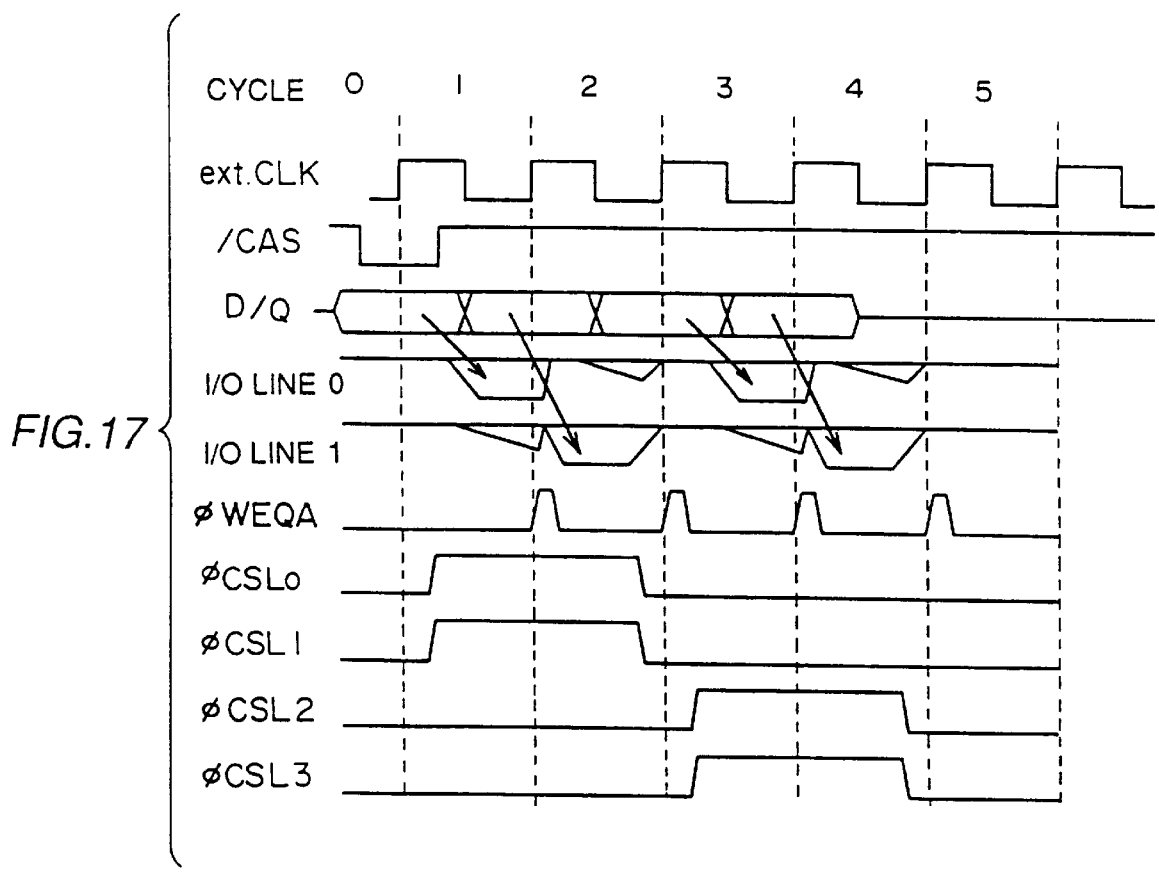
FIG.17
FIG.18
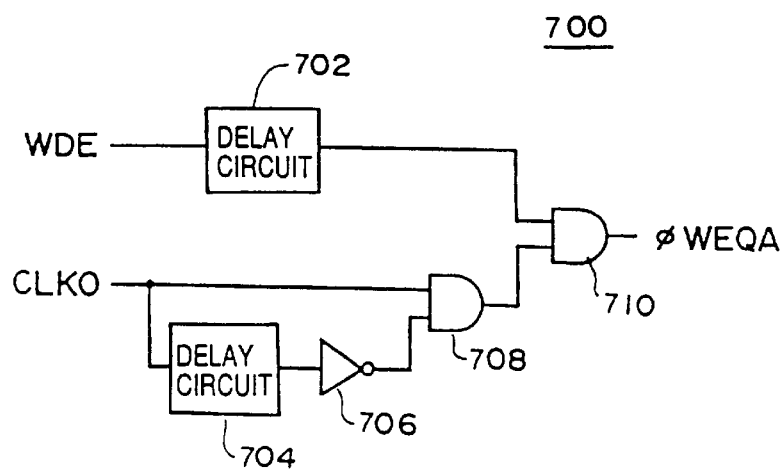

SYNCHRONOUS SEMICONDUCTOR MEMORY DEVICE CAPABLE OF REDUCING DELAY TIME AT DATA INPUT/ OUTPUT LINE UPON DATA INPUT

This application is a continuation of application Ser. No. 08/717,586 filed Sep. 20, 1996, abandoned.

BACKGROUND OF THE INVENTION

1. Field of the Invention

The present invention relates to synchronous semiconductor memory devices and, more particularly, to a synchronous semiconductor memory device incorporating external signals including a control signal, an address signal, and a data signal in synchronization with an external clock signal.

2. Description of the Background Art

Although a dynamic random access memory (hereinafter referred to as a DRAM) used as a main memory operates at an increased speed, the operation speed thereof still cannot catch up with operation speed of a microprocessor (hereinafter referred to as MPU). Therefore, it has been often stated that access time and cycle time of a DRAM are bottleneck thereof to result in lower performance of the entire system. In recent years, a proposal is made to use a synchronous DRAM (hereinafter referred to as SDRAM) operating in synchronization with a clock signal as a main memory for a high speed MPU.

A specification of an SDRAM is proposed in which a high speed access is made to successive bits, for example successive 8 bits, for one data input/output terminal in synchronization with a system clock signal. A standard timing chart satisfying such specification of successive access is shown in FIG. 28. FIG. 28 shows operation of reading out data of 8 bits successively in an SDRAM that can input and output data of 8 bits (1 byte) at data input/output terminals DQ0 to DQ7. That is, data of 64 bits (8 bits×8=64 bits) can be written successively.

The number of bits of data to be read out or written successively is called a burst length, which can be changed by a mode register in an SDRAM.

As shown in FIG. 28, external control signals such as a row address strobe signal /RAS, a column address strobe signal /CAS, and an address signal Add are incorporated at a rising edge of an external clock signal CLK serving as a system clock in an SDRAM.

Address signal Add includes a row address signal X$a$ and a column address signal Y$b$ multiplexed in a time-divisional manner.

At a rising edge of clock signal CLK in cycle 1, when an external row address strobe signal ext./RAS is activated at an "L" (Low) level and an external column address strobe signal ext./CAS and an external write enable signal ext./WE are at "H" (High) level, address signal Add applied at this point in time is incorporated as row address signal X$a$.

Next, at a rising edge of clock signal CLK in cycle 4, when external column address strobe signal ext./CAS is activated at an "L" level, address signal Add applied at this point in time is incorporated as column address signal Y$b$. Row and column selecting operation is carried out in the SDRAM in accordance with the incorporated row address signal X$a$ and column address signal Y$b$. After a predetermined clock period (6 clock cycles in FIG. 28) has been elapsed from the fall of external row address strobe signal ext./RAS to an "L" level, first data b0 of the 8-bit data to be output from data input/output terminal DQ is applied.

Thereafter, data b1–b7 are applied in response to the rise of clock signal CLK.

FIG. 29 is a timing chart showing the state of the external signals when 8-bit data is written successively for one data input/output terminal DQ in an SDRAM.

In writing operation, row address signal X$a$ is incorporated similarly to data readout. More specifically, when signal ext./RAS is activated at an "L" level and signals ext./CAS and ext./WE are at an "H" level at the rising edge of clock signal CLK in cycle 1, address signal Add applied at this point in time is incorporated as row address signal X$a$. At the rising edge of clock signal CLK in cycle 4, when signals ext./CAS and ext./WE are activated at an "L" level, column address signal Y$b$ is incorporated and data b0 applied to data input/output terminal DQ at this point in time is incorporated as the first write data of the 8-bit data to be written successively. In response to the rising edges of signals ext./RAS and ext./CAS, row and column selecting operation is carried out in the SDRAM. Thereafter, in synchronization with clock signal CLK, input data b1–b7 is incorporated and written in the corresponding memory cells sequentially.

As described above, in contrast to the method of incorporating for operation an address signal, input data, and the like in synchronization with external control signals of row address signal ext./RAS and column address strobe signal ext./CAS in a conventional DRAM, external signals such as address strobe signals ext./RAS and ext./CAS, an address signal and input data are incorporated at the rising edge of clock signal CLK, which is an externally applied system clock, in an SDRAM.

Thus, an SDRAM performs operation of incorporating the control signal and the data signal in synchronization with the external clock signal, thereby eliminating the need for securing a margin for data input/output time in view of skew (a lag in timing) of the address signal. As a result, cycle time can be advantageously reduced. Thus, since successive data can be written and read out in synchronization with the clock signal, access time for making successive access to successive addresses can be reduced.

Choi et al. has presented a 2-bit prefetch SDRAM for writing data of 2 bits as one unit as an architecture for implementing an SDRAM (in 1993 Symposium on VLSI circuit). Description of the 2-bit prefetch operation will be described hereinafter with reference to the drawing.

FIG. 30 functionally shows the structure of a main part of a conventional SDRAM performing 2-bit prefetch operation. Referring to FIG. 30, the structure of a functional portion related to 1-bit input/output data in the SDRAM with x8 bit structure An array portion related to a data input/output terminal DQ$i$ includes a memory cell array 71$a$ forming a bank A and a memory cell array 71$b$ forming a memory array bank B. Banks A and B can be accessed independently.

Memory cell array bank A is further divided into memory cell array banks A0 and A1. Determination as to whether write data is written in memory cell array bank A0 or memory cell array bank A1 is made in accordance with the value of the least significant bit of the address applied when the write command is input.

Similarly, when memory cell array bank B is selected, determination as to whether write data is written in memory cell array bank B0 or memory cell array bank B1 is made in accordance with the least significant bit of the address applied when the write command is input.

Memory cell array banks A0 and A1 are each provided with an X decoder group 52$a$ including a plurality of row decoders each decoding address signals X0–Xj and selecting a corresponding row of memory cell array 71a, a Y decoder group 53a including a plurality of column decoders each decoding column address signals Y1–Yk and selecting a corresponding column of memory cell array 71a, and a sense amplifier group 54a for detecting and amplifying data of the memory cells connected to the selected row in memory cell array group 71a.

Memory cell array banks A0 and A1 are further provided with an internal data transmission line (global I/O line) for transmitting the data detected and amplified by sense amplifier group 54a and transmitting write data to the selected memory cell of memory cell array 71a. A write register 59a and a write buffer group 60a are provided corresponding to a global I/O line pair GIO0 which corresponds to memory cell array bank A0, and a write register 59a' and a write buffer group 60a' are provided corresponding to a global I/O line pair GIO1 which corresponds to memory cell array bank A1. A selector 69a for switching an output of an input buffer 58a to be applied to two write registers 59a and 59a' in accordance with the value of the least significant bit of the address applied when the write command is applied. An equalizing circuit group 61a is provided common to the two global I/O line pairs GIO0 and GIO1.

Another set of circuits similar to those in memory cell array bank A is provided in memory cell array bank B. Since description below will be made of operation of the SDRAM focusing on write operation thereof, FIG. 30 shows only the structure of the circuits related to writing.

Now, brief description will be made of operation of the conventional SDRAM shown in FIG. 30. FIG. 31 is a timing chart describing write operation of the conventional SDRAM. Description below relates to an example where the value of a low order address is "0", the burst length equals to 4 and data is written in bank A. In other words, successive 4-bit data is written in memory cell bank A.

In FIG. 31 as well, an arbitrary one of data input/output terminals is represented as DQ. At the rising edge of external clock signal ext.CLK in cycle 1, in response to external column address strobe signal ext./CAS being activated at an "L" level, column address signal Yb is incorporated and a corresponding Y decoder is activated. More specifically, a column selection signal φCSL0 corresponding to a selected column in Y decoder group A0 and a column selection signal φCSL1 corresponding to a selected memory cell column in Y decoder group A1 change to an "H" level in an activated state.

At the rising edge of clock signal ext.CLK in cycle 1, the first data d0 applied to data input/output terminal DQ is stored in write register 59a, and then data d0 stored in write register 59a is applied to global I/O line pair GIO0 in response to activation of a write buffer activation signal φWBA0 output from a second control signal generation circuit 63. The data applied to global I/O line pair GIO0 is written in a corresponding memory cell in the memory cell column selected by column selection signal φCSL0.

At the rising edge of external clock signal ext.CLK in cycle 2, data d1 is incorporated from data input/output terminal DQ and stored in write register 59a'. In response to activation of a write buffer activation signal φWBA1 applied from second control signal generation circuit 63, data d1 is output to global I/O line pair GIO1. Data d1 is also written in a corresponding memory cell in a column selected by a signal φCSL1.

In the manner described above, data of 2 bits is written and after completion thereof write buffer activation signals φWBA0 and φWBA1 are both inactivated. As a result, write registers 59a and 59a' are electrically disconnected from global I/O line pairs GIO0 and GIO1.

In response to the rising edge of external clock signal ext.CLK in cycle 3, an equalize signal φWEQA is applied from second control signal generation circuit 63, and in response thereto equalizing circuit 61a equalizes global I/O line pairs GIO0 and GIO1 connecting memory cell array banks A0 and A1 and write buffer groups 60a and 60a', respectively.

In response to the rising edge of signal ext.CLK in cycle 3, data d2 applied to data input/output terminal DQ is incorporated and stored in write register 59a. Furthermore, in response to the rising edge of signal ext.CLK in cycle 3, a column selection signal φCSL2 selecting a memory cell column including a memory cell to which data is next written in memory cell array bank A0 and a column selection signal φCSL3 selecting a memory cell column including a memory cell to which data is next written in memory cell array bank A1 are activated (attaining an "H" level). Thus, in response to activation of write buffer activation signal φWBA0, data d2 is written in the corresponding memory cell in memory cell array bank A0.

At the rising edge of signal ext.CLK in cycle 4, data d3 is next incorporated and stored in write register 59a'. In response to activation of write buffer activation signal φWBA1, data d3 is written in a corresponding memory cell in memory cell array bank A1.

Thus, the SDRAM performing 2-bit prefetch operation writes data every 2 clock cycles, and therefore sufficient time can be taken for data writing even if the external clock signal has an increased frequency, thereby easily achieving increase in operation frequency.

However, during the 2-bit prefetch operation of the conventional SDRAM described above, in the cycle when writing operation is performed for a head data (data of the first bit to be written), the memory cell column to which data of the second bit is to be written is selected simultaneously and connected with an I/O line pair. Therefore, the potential of the I/O line pair used for writing the data of the second bit is changed, in accordance with the data held previously in the memory cell where the data of the second bit is to be written, in the cycle when the data of the first bit is written. As a result, in the cycle for writing the data of the second bit, the potential of the I/O line pair having a complementary structure must be inverted if the data opposite to the data held previously is to be written.

Extra time is required for inversion of the potential of the I/O line pair with a great stray capacitance, causing increase in time for writing and degradation in operable frequency.

SUMMARY OF THE INVENTION

An object of the present invention is to provide a synchronous semiconductor memory device capable of operating at a high speed.

Another object of the present invention is to provide a synchronous semiconductor memory device performing 2-bit prefetch operation that is capable of reducing time required for change in potential of an I/O line pair upon data writing.

In short, the present invention relates to a synchronous semiconductor memory device incorporating external signals which include a control signal, an address signal, and a data signal in synchronization with an external clock signal and including a memory cell array, first and second signal input/output line pairs, a frequency-dividing circuit, a selecting circuit, a data input circuit, and a connecting circuit.

The memory cell array includes a plurality of memory cells arranged in a matrix. The first and second signal input/output line pairs communicate the data signal with the memory cell array. The frequency-dividing circuit divides the frequency of the external clock signal and outputs an internal clock signal. The selecting circuit successively selects a corresponding memory cell in the memory cell array in accordance with the address signal. The data input circuit is controlled in accordance with the external clock signal, receives and holds the data signal applied serially, and outputs in parallel the data signal to the corresponding one of the first and second signal input/output line pairs. The connecting circuit is controlled in accordance with the internal clock signal and connects the first and second signal input/output line pairs and the memory cells selected by the selecting circuit and corresponding thereto in the cycle of the external clock signal subsequent to the cycle in which a head data of the serially input data signals is applied.

According to another aspect of the present invention, the present invention relates to a synchronous semiconductor memory device incorporating external signals which include a control signal, an address signal, and a data signal in synchronization with an external clock signal and including a memory cell array, first and second signal input/output line pairs, a frequency-dividing circuit, a selecting circuit, a data input circuit, and first and second connecting circuits.

The memory cell array includes a plurality of memory cells arranged in a matrix. The first and second signal input/output line pairs communicate the data signal with the memory cell array. The frequency-dividing circuit divides the frequency of the external clock signal and outputs first and second internal clock signals which change alternately to each other. The selecting circuit successively selects a corresponding memory cell in the memory cell array in accordance with the address signal. The data input circuit is controlled in accordance with the external clock signal, receives and holds the data signal applied serially, and outputs in parallel the data signal to corresponding one of the first and second signal input/output line pairs. The first connecting circuit is controlled in accordance with the first internal clock signal and connects the first signal input/output line pair and the corresponding memory cell selected by the selecting circuit. The second connecting circuit is controlled in accordance with the second internal clock signal and connects the second signal input/output line pair and the corresponding memory cell selected by the selecting circuit.

According to still another aspect of the present invention, the present invention relates to a synchronous semiconductor memory device incorporating external signals which include a control signal, an address signal, and a data signal in synchronization with an external clock signal and including a memory cell array, first and second signal input/output line pairs, a frequency-dividing circuit, a selecting circuit, a data input/output circuit, a connecting circuit, a driving circuit, and an equalizing circuit.

The memory cell array includes a plurality of memory cells arranged in a matrix. The first and second input/output line pairs communicate the data signal with the memory cell array. The frequency-dividing circuit divides the frequency of the external clock signal and outputs an internal clock signal. The selecting circuit successively selects a corresponding memory cell in the memory cell array in accordance with the address signal. The data input circuit is controlled in accordance with the external clock signal, receives and holds the data signal applied serially, and outputs in parallel the data signal to corresponding one of the first and second signal input/output line pairs. The connecting circuit is controlled in synchronization with initiation of data signal input in accordance with the internal clock signal and connects the first and second signal input/output line pairs and the memory cells selected by the selecting circuit and corresponding thereto. The driving circuit has an input node pair connected to one of the first and second signal input/output line pairs through the connecting circuit and outputs the above-mentioned corresponding signal to the corresponding one of the memory cells. The equalizing circuit is controlled in accordance with the external clock signal and equalizes the first and second signal input/output line pairs.

According to a further aspect of the present invention, the present invention relates to a synchronous semiconductor memory device incorporating external signals which include a control signal, an address signal, and a data signal in synchronization with an external clock signal and including a memory cell array, first and second signal input/output line pairs, a frequency-dividing circuit, a selecting circuit, a data input circuit, a connecting circuit, a driving circuit, and first and second equalizing circuits.

The memory cell array includes a plurality of memory cells arranged in a matrix. The first and second signal input/output line pairs communicate the data signal with the memory cell array. The frequency-dividing circuit divides the frequency of the external clock signal and outputs an internal clock signal. The selecting circuit successively selects a corresponding memory cell in the memory cell array in accordance with the address signal. The data input circuit is controlled in accordance with the external clock signal, receives and holds the data signal applied serially, and outputs in parallel the data signal to corresponding one of the first and second signal input/output line pairs. The connecting circuit is controlled in synchronization with initiation of data signal input in accordance with the internal clock signal and connects the first and second signal input/ output line pairs and the memory cells selected by the selecting circuit and corresponding thereto. The driving circuit has an input node pair connected to one of the first and second signal input/output line pairs through the connecting circuit and outputs the corresponding signal to the corresponding memory cell. The first equalizing circuit is controlled in accordance with the internal clock signal and equalizes the first signal input/output line pair. The second equalizing circuit is controlled in accordance with the external clock signal and equalizes the second signal input/output line pair.

Therefore, a main advantage of the present invention is that, when data of plural bits is successively written, the potential level of the data input/output line pair with a great parasitic capacitance and the like need not be inverted in accordance with the value of write data, thereby achieving high-speed writing operation.

Another advantage of the present invention is that a column selection line is shared by two memory cell columns including memory cells where data is written successively in 2-bit prefetch operation, thereby realizing interconnection arrangement advantageous for high integration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a timing chart showing operation of column selecting operation control circuit 1100.

FIG. 5 is a circuit block diagram showing the structure of a Y decoder activation signal generation circuit.

FIG. 6 is a circuit block diagram showing the structure of a Y decoder.

FIG. 14 is a timing chart showing operation of column selecting operation control circuit 2100.

FIG. 15 is a circuit block diagram showing the structures of Y decoder activation signal generation circuits 682 and 684.

FIG. 17 is a timing chart showing operation of an SDRAM in accordance with a third embodiment of the present invention.

FIG. 18 is a schematic block diagram showing the structure of a circuit for generating a signal φWEQA.

DESCRIPTION OF THE PREFERRED EMBODIMENTS

Embodiment 1

Figure 1:
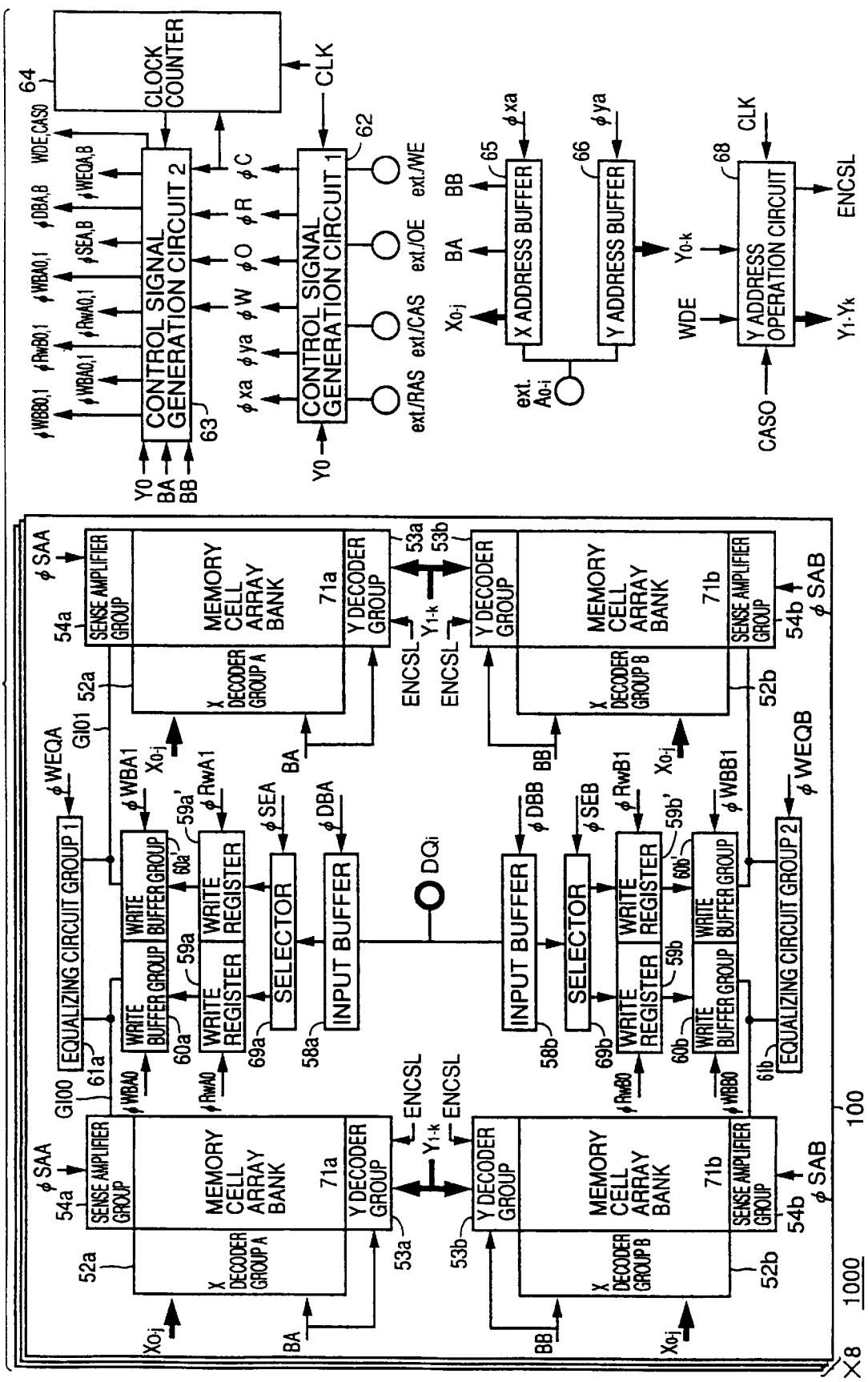
FIG. 1 is a schematic block diagram showing the structure of an SDRAM 1000 in accordance with a first embodiment of the present invention.

FIG. 1 is a block diagram functionally showing the structure of a main part of an SDRAM 1000 in accordance with a first embodiment of the present invention. FIG. 1 shows the structure of a functional portion, related to input/output data of 1 bit, of the SDRAM with x8 bit structure.

A memory cell array portion related to data input/output terminal DQ$i$ includes memory cell array 71$a$ forming bank A and memory cell array 71$b$ forming bank B.

Bank A is further divided into memory cell array banks A0 and A1 selected in accordance with an address signal, and memory cell array bank B is divided into memory cell array banks B0 and B1, as will be described below.

Memory cell array banks A0 and A1 each include X decoder group 52$a$ including a plurality of row decoders each decoding address signals A0–Aj and selecting a corresponding row of memory cell array 71$a$, Y decoder group 53$a$ including a plurality of column decoders each decoding column address signals Y1–Yk and selecting a corresponding column of memory cell array 71$a$, and sense amplifier group 54$a$ for detecting and amplifying data of the memory cells connected to the selected row of memory cell array 71$a$.

X decoder group 52$a$ includes row decoders provided corresponding to each word line of memory cell array 71$a$. In accordance with address signals X0–Xj, the corresponding row decoder selects the word line provided corresponding to the row decoder.

Y decoder group 53$a$ includes column decoders provided corresponding to each column selection line of memory cell array 71$a$. One column selection line selects four bit line pairs. In each of memory cell array banks A0 and A1, 4-bit memory cells are selected simultaneously by X decoder group 52$a$ and Y decoder group 53$a$. X decoder group 52$a$ and Y decoder group 53$a$ are activated by a bank designation signal BA. Each of memory cell array banks B0 and B1 also includes X decoder group 52$b$ and Y decoder group 53$b$, which are activated by a bank designation signal BB.

Bank A also includes an internal data transmission line (global I/O line) for transmitting the data detected and amplified by sense amplifier group 54$a$ and transmitting write data to the selected memory cells in memory cell array 71$a$. Memory cell array bank A0 is provided with a global I/O line bus GIO0, while memory cell array bank A1 is provided with a global I/O line bus GIO1. One global I/O line bus includes four global I/O line pairs for communicating data simultaneously with 4-bit memory cells selected simultaneously.

Write register 59$a$ and write buffer group 60$a$ are provided corresponding to global I/O line pair GIO0 for memory cell array bank A0, while write register 59$a'$ and write buffer group 60$a'$ are provided corresponding to global I/O line pair GIO1 for memory cell array bank A1.

Input buffer 58a with 1-bit width produces internal write data from the input data applied to data input/output terminal DQi. Selector 69a is controlled by a selector control signal φSEA applied from second control signal generation circuit 63, and switches an output of input buffer 58a and applies it to two write registers 59a and 59a'. More specifically, input buffer 58a is activated in response to input buffer activation signal φDBA, and produces the internal write data from the input data applied to data input/output terminal DQi. Selector 69a is controlled in accordance with selector control signal φSEA applied from second control signal generation circuit 63 in response to the address signal, and applies the internal write data to one of write registers 59a and 59a', as will be described below. Write registers 59a and 59a' are activated in response to register activation signals φRwA0 and φRwA1, respectively, and sequentially store the write data applied from selector 69a. Write buffer groups 60a and 60a' are activated in response to write buffer activation signals φWBA0 and φWBA1, amplify the data stored in the corresponding write registers 59a and 59a', and transmit the data to corresponding global I/O line pair buses GIO0 and GIO1, respectively.

Equalizing circuit group 61a is provided common to two global I/O line pairs GIO0 and GIO1, and activated in response to equalizing circuit activation signal φWEQA and equalizes global I/O line pair buses GIO0 and GIO1.

Write buffer groups 60a and 60a' and write registers 59a and 59a' have a 8-bit width.

Similarly, memory cell array bank B includes memory cell array banks B0 and B1. Memory cell array banks B0 and B1 each include X decoder group 52b, Y decoder group 53b, sense amplifier group 54b activated in response to sense amplifier activation signal φSAB, equalizing circuit group 61b activated in response to equalizing circuit activation signal φWEQB, write buffer groups 60b and 60b' activated in response to buffer activation signals φWBB0 and φWBB1 respectively, write registers 59b and 59b' activated in response to register activation signals φRwB0 and φRwB1 respectively, selector 69b controlled by selector control signal φSEB, and input buffer 58b activated in response to buffer activation signal φBB.

Banks A and B are identical in structure. By providing write registers 59a and 59a' and 59b and 59b', data can be input/output to/from one data input/output terminal DQi in synchronization with a high-speed clock signal.

Regarding the control signals for banks A and B, only the control signal for one of the two banks is generated in accordance with bank designation signals BA and BB.

A function block 100 shown in FIG. 1 is provided corresponding to each data input/output terminal. In an SDRAM with x8 bit structure, eight function blocks 100 are included corresponding to respective data input/output terminals.

By thus providing banks A and B with the substantially identical structure and selecting only one of the two banks by bank designation signals BA and BB, banks A and B can perform substantially completely independent operation.

As the control system for driving banks A and B independently from each other, first and second control signal generation circuits 62 and 63 and a clock counter 64 are provided.

First control signal generation circuit 62 incorporates, in synchronization with external clock signal CLK, externally applied control signals, namely, external row address strobe signal ext./RAS, external column address strobe signal ext./CAS, an external output enable signal ext./OE, and an external write enable signal (signal that permits writing) ext./WE, and generates internal control signals φxa, φya, φW, φO, φR, and φC.

In response to bank designation signals BA and BB, the least significant bit Y0 of the external address signal, internal control signals φW, φO, φR and φC, and output of clock counter 64, second control signal generation circuit 63 generates: control signals for independently driving banks A and B, namely, equalizing circuit activation signals φWEQA and φWEQB, sense amplifier activation signals φSAA and φSAB, write buffer activation signals φWBA0, φWBA1, φWBB0 and φWBB1, write register activation signals φRwA0, φRwA1, φRwB0, and φRwB1, selector control signals φSEA and φSEB, input buffer activation signals φDBA and φDBB; signal CAS0 activated (attaining an "L" level) if the timing of the external control signal indicates writing operation; and a write decode enable signal WDE activated (attaining an "H" level) during writing operation.

SDRAM 1000 further includes, as peripheral circuits, an X address buffer 65 responsive to internal control signal φSA for incorporating external address signals ext./A0 to ext./Ai and generating internal address signals X0–Xj and bank selecting signals BA and BB, and a Y address buffer 66 activated in response to internal control signal φya for outputting column selection signals Y0–Yk for specifying a column selection line.

SDRAM 1000 further includes as a peripheral circuit a Y address operation circuit 68 controlled by clock signal CLK for receiving signal WDE and an output signal CASD of Y address buffer 66 and applying the column selection signals Y1–Yk and a Y decoder activation signal ENCSL.

Figure 7:
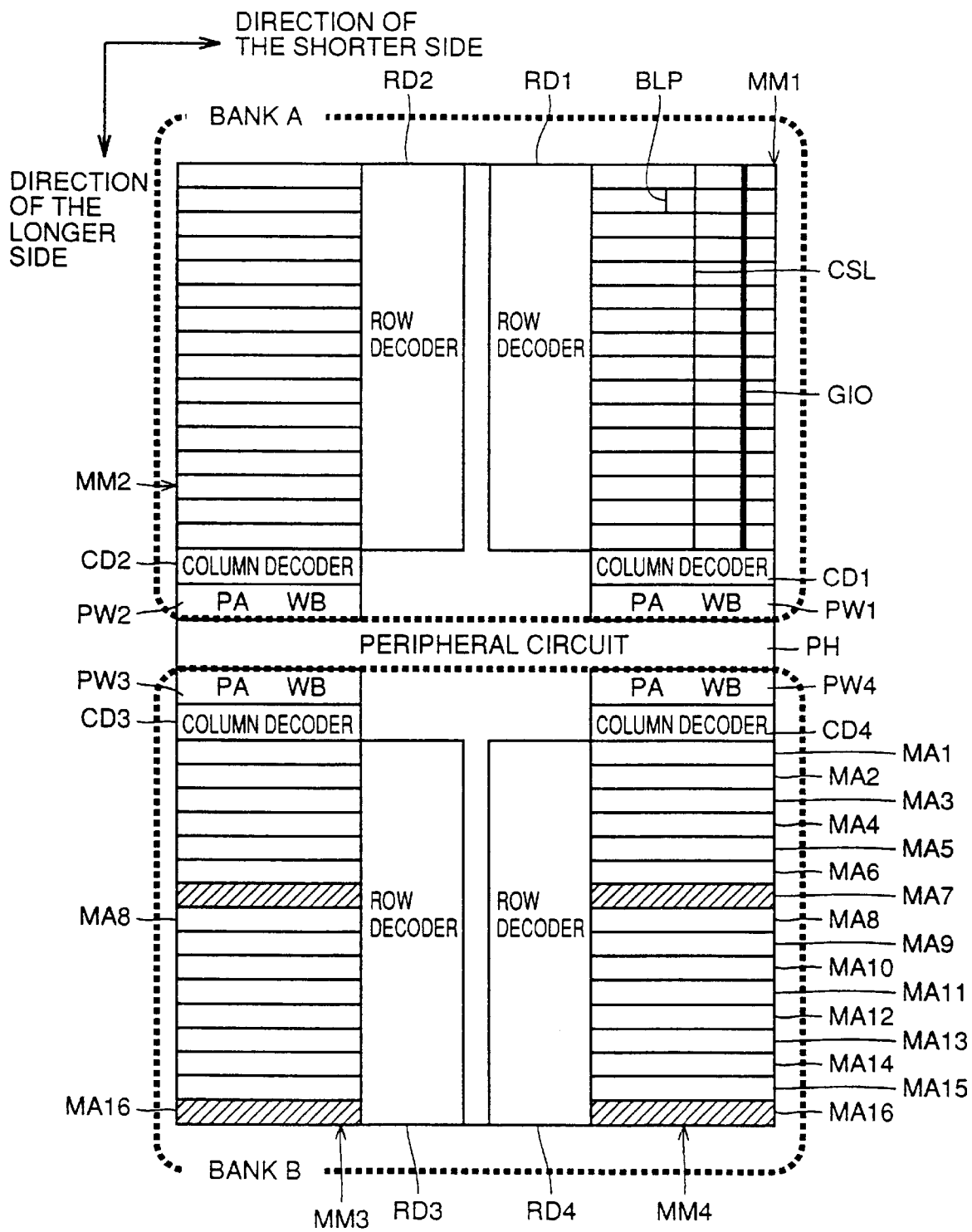
FIG. 7 shows the chip layout of SDRAM 1000.

FIG. 7 shows the chip layout of SDRAM 1000. Referring to FIG. 7, the chip layout of a 16 M-bit SDRAM with 2 M word×8 bit structure is shown as an example.

SDRAM 1000 includes four memory mats MM1–MM4 each having storage capacity of 4 M bits. Each of memory mats MM1–MM4 includes 16 memory cell arrays MA1–MA16 each having storage capacity of 256K bits.

Row decoders RD1–RD4 are arranged in the direction of the longer side of the chip inner periphery of memory mats MM1–MM4, respectively. In addition, on the respective central sides of memory mats MM1–MM4 with respect to the chip, column decoders CD1–CD4 are arranged in the direction of the shorter side. At an output of column decoder CD (column decoders CD1–CD4 are generically indicated by character CD), column selection line CSL is arranged extending across respective arrays of the corresponding memory mat MM (memory mats MM1–MM4 are generically indicated by MM). One column selection line CSL selects four pairs of bit lines simultaneously.

Global I/O line pair GIO for transmitting internal data is arranged extending across respective memory arrays of memory mat MM in the direction of the longer side thereof.

For respective memory mats MM1–MM4, input/output circuits PW1–PW4 are arranged on the central side of the chip, each including a preamplifier PA for amplifying data read out from the selected memory cell and a write buffer WB for transmitting write data to the selected memory cell.

SDRAM 1000 shown in FIG. 7 includes two banks A and B capable of performing precharge operation and activation operation (word line selecting and sensing operation and column selecting operation) independently from each other, as shown in FIG. 1. Bank A includes memory mats MM1 and MM2, while bank B includes memory mats MM3 and MM4. The number of the banks provided is changeable.

Each of memory mats MM1–MM4 includes two array blocks (with storage capacity of 2 M bits). One array block is formed by memory cell arrays MA1–MA8, and the other array block is formed by memory cell arrays MM9–MM16. At most one memory cell array is selected in one array block. Four memory cell arrays are activated simultaneously. More specifically, one memory cell array is selected from each array block of each memory mat in the selected bank. For example, FIG. 7 shows an example where memory cell arrays MA7 and MA16 of memory mat MM3 and memory cell arrays MA7 and MA16 of memory mat MM4 are activated.

Two column selection lines CSL are selected simultaneously. One column selection line CSL selects four pairs of bit lines. Therefore, memory cells of 8 bits (2×4=8) are selected simultaneously.

Figure 8:
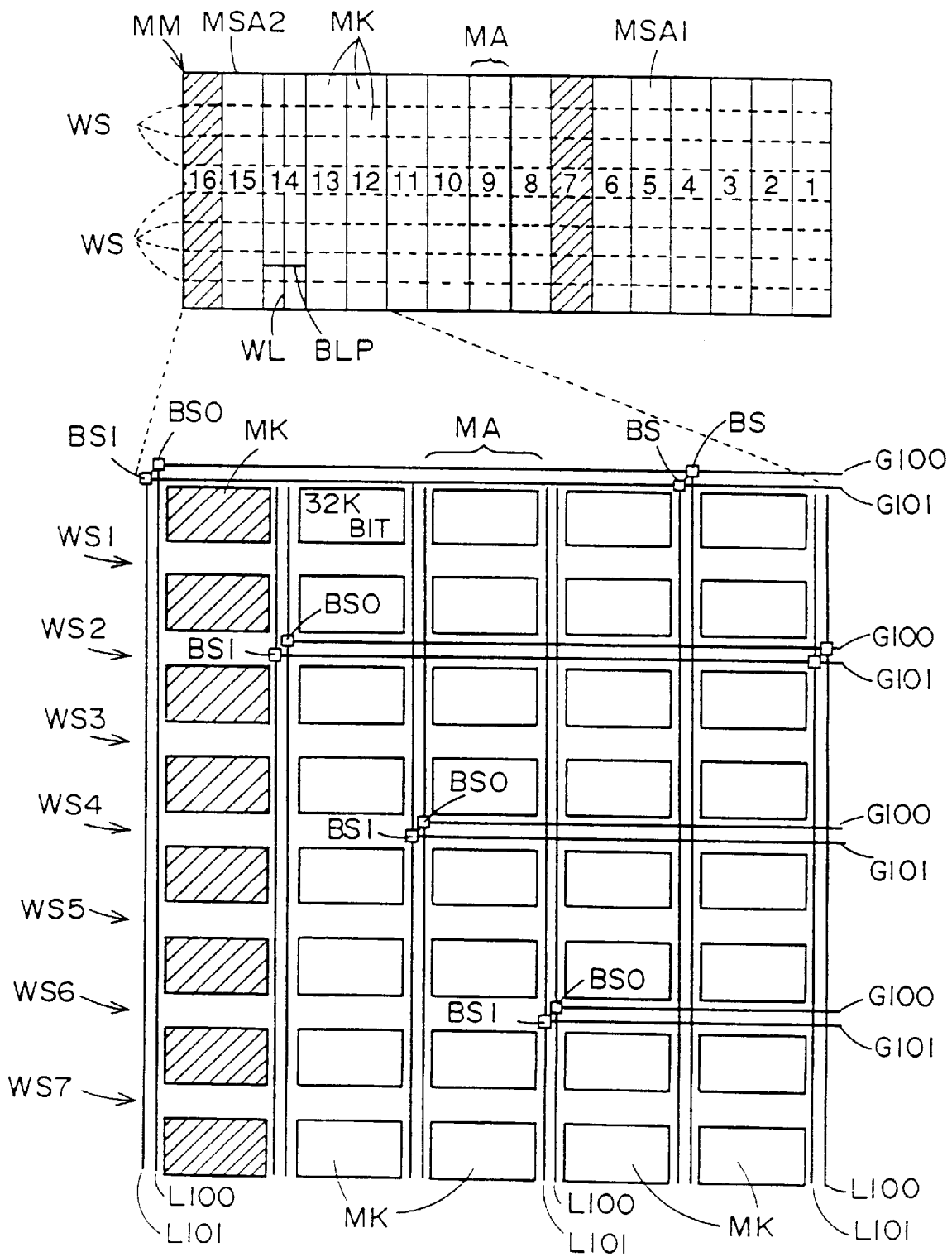
FIG. 8 shows specific arrangement of I/O line pairs of a memory cell array of the chip shown in FIG. 7.

FIG. 8 shows a specific arrangement of I/O lines in SDRAM 1000 shown in FIG. 7. In SDRAM 1000, two global I/O line pairs GIO0 and GIO1 are arranged along the longer side of memory mat MM, and these two global I/O line pairs GIO0 and GIO1 are arranged for each of three word line shunt regions WS2, WS4 and WS6.

In word line shunt region WS, a metal interconnection of, for example, aluminum having a low resistance value is arranged in parallel to word line WL formed of polysilicon in order to reduce the resistance of the word line, and the polysilicon word line and the metal interconnection with low resistance are electrically connected. Since connection should be made between the polysilicon word line at a layer below bit line BL and the metal interconnection with low resistance at a layer over the bit line, the bit line, i.e. the memory cell, does not exist in word line shunt region.

Two local I/O line pairs LIO0 and LIO1 are provided to connect two global I/O line pairs GIO0 and GIO1 with the selected 256K-bit memory array MA. For one 256K-bit memory array MA, two local I/O line pairs LIO0 and LIO1 are arranged on one side of memory cell array MA in parallel to the shorter side of the memory mat, and two local I/O line pairs LIO0 and LIO1 are arranged on the other side thereof. Therefore, four local I/O line pairs are arranged in total for one memory cell array MA. Two local I/O line pairs LIO0 and LIO1 are shared by adjacent two 256K-bit memory cell arrays MA.

A block selection switch BS0 is arranged for connecting global I/O line pair GIO0 and local I/O line pair LIO0. A block selection switch BS1 is arranged for connecting global I/O line pair GIO1 and local I/O line pair LIO1. Each pair of block selection switches BS0 and BS1 is arranged at an end of memory mat MM and at three word line shunt regions WS2, WS4 and WS6 in this order.

Figure 9:
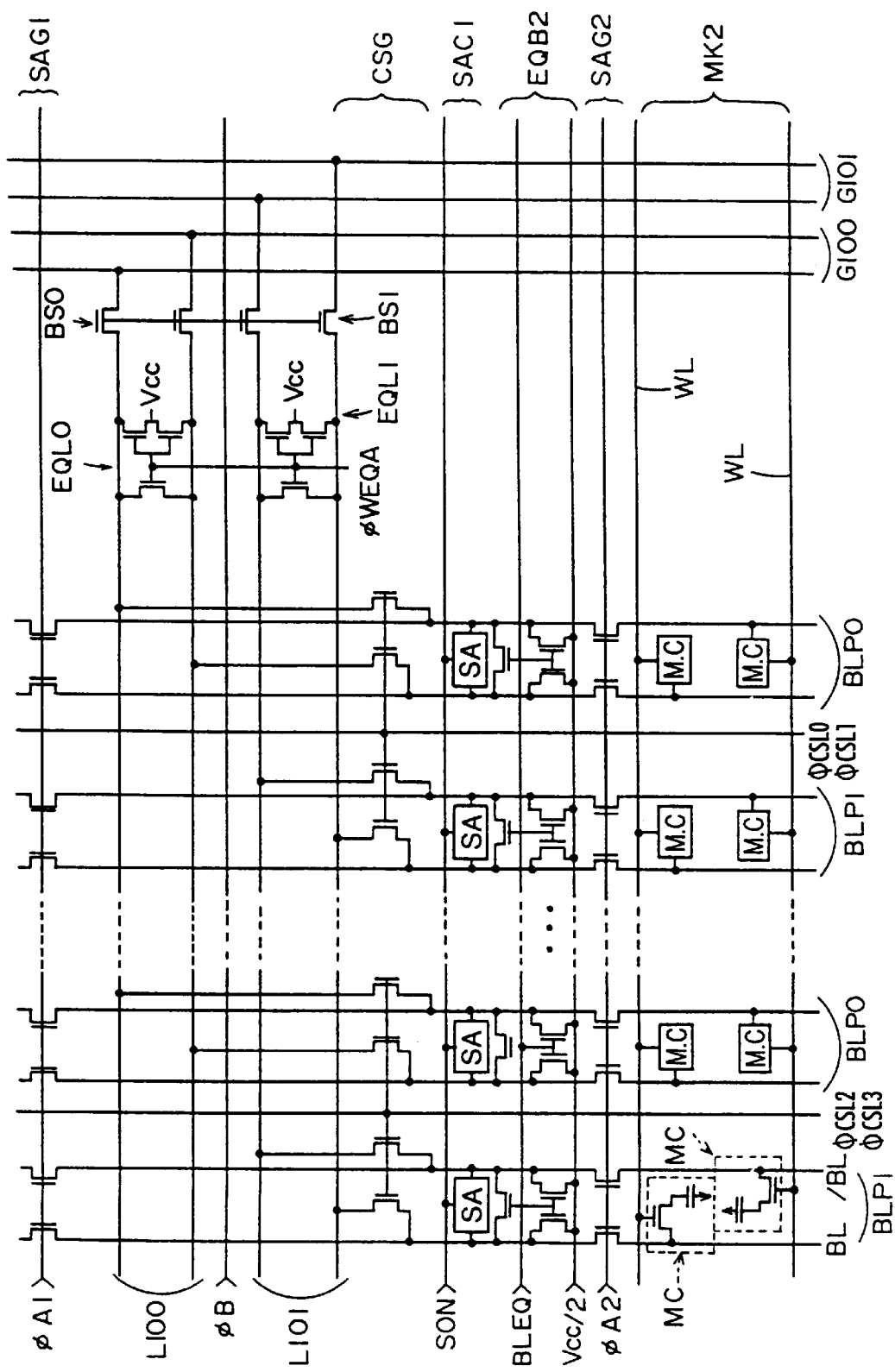
FIG. 9 is an enlarged diagram of the portion shown in FIG. 8.

FIG. 9 is a circuit block diagram showing partially omitted structure of a portion related to one of eight 32 K-bit memory arrays MK forming 256K-bit memory cell array MA. Referring to FIG. 9, global I/O line pairs GIO0 and GIO1, local I/O line pairs LIO0 and LIO1, and block selection switches BS0 and BS1 are provided in this SDRAM 1000. For two local I/O line pairs LIO0 and LIO1, two local I/O line pair equalizing circuits EQL0 and EQL1 are provided controlled by signal φWEQA.

One column selection line CSL is arranged corresponding to two bit line pairs BLP0 and BLP1. The two bit line pairs BLP0 and BLP1 selected by one column selection line CSL are connected to two local I/O line pairs LIO0 and LIO1 through a column selection gate CSG.

More specifically, in the arrangement of SDRAM 1000, of the two bit line pairs BLP0 and BLP1 selected by one column selection line CSL, bit line pair BLP0 belongs to memory cell array bank A0 and bit line pair BLP1 belongs to memory cell array bank A1 shown in FIG. 1.

Figure 10:
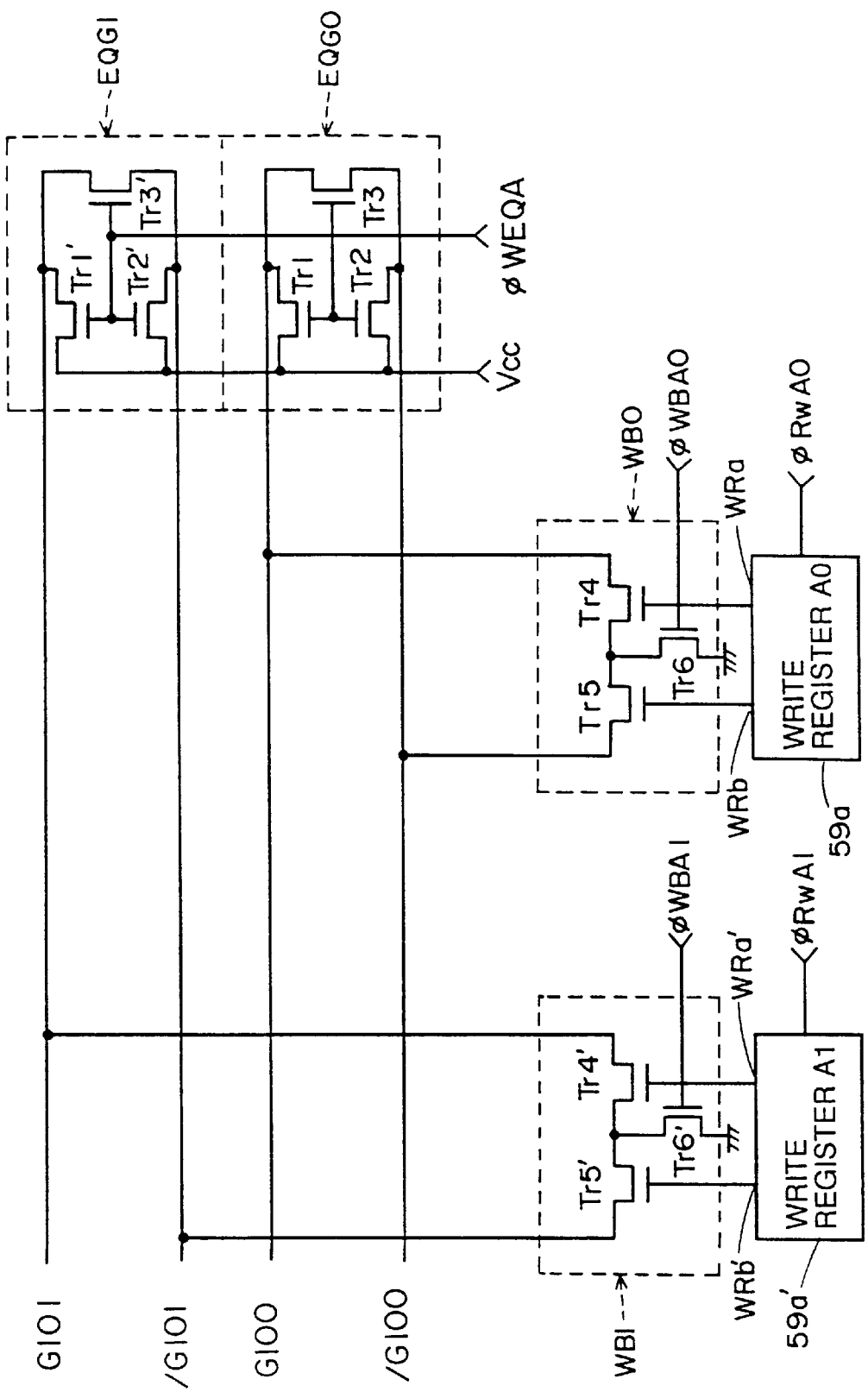
FIG. 10 is a circuit block diagram showing the structure of a portion related to writing operation of the SDRAM shown in FIG. 1.

FIG. 10 is a circuit block diagram showing a specific structure of a portion related to the writing operation of the SDRAM shown in FIG. 9.

Referring to FIG. 10, in SDRAM 1000, write buffer WB0 and equalizing circuit EQG0 are provided corresponding to global I/O line pair GIO0, and write buffer WB1 and equalizing circuit EQG1 are provided corresponding to global I/O line pair GIO1. Write buffers WB0 and WB1 are activated by signals φWBA0 and φWBA1, respectively. Equalizing circuits EQG0 and EQG1 are activated by equalizing circuit activation signal φWEQA. Write registers 59a and 59a' are activated by register activation signals φRwA0 and φRwA1, respectively.

Based on the description above, operation of SDRAM 1000 in accordance with the first embodiment will be described below.

Figure 2:
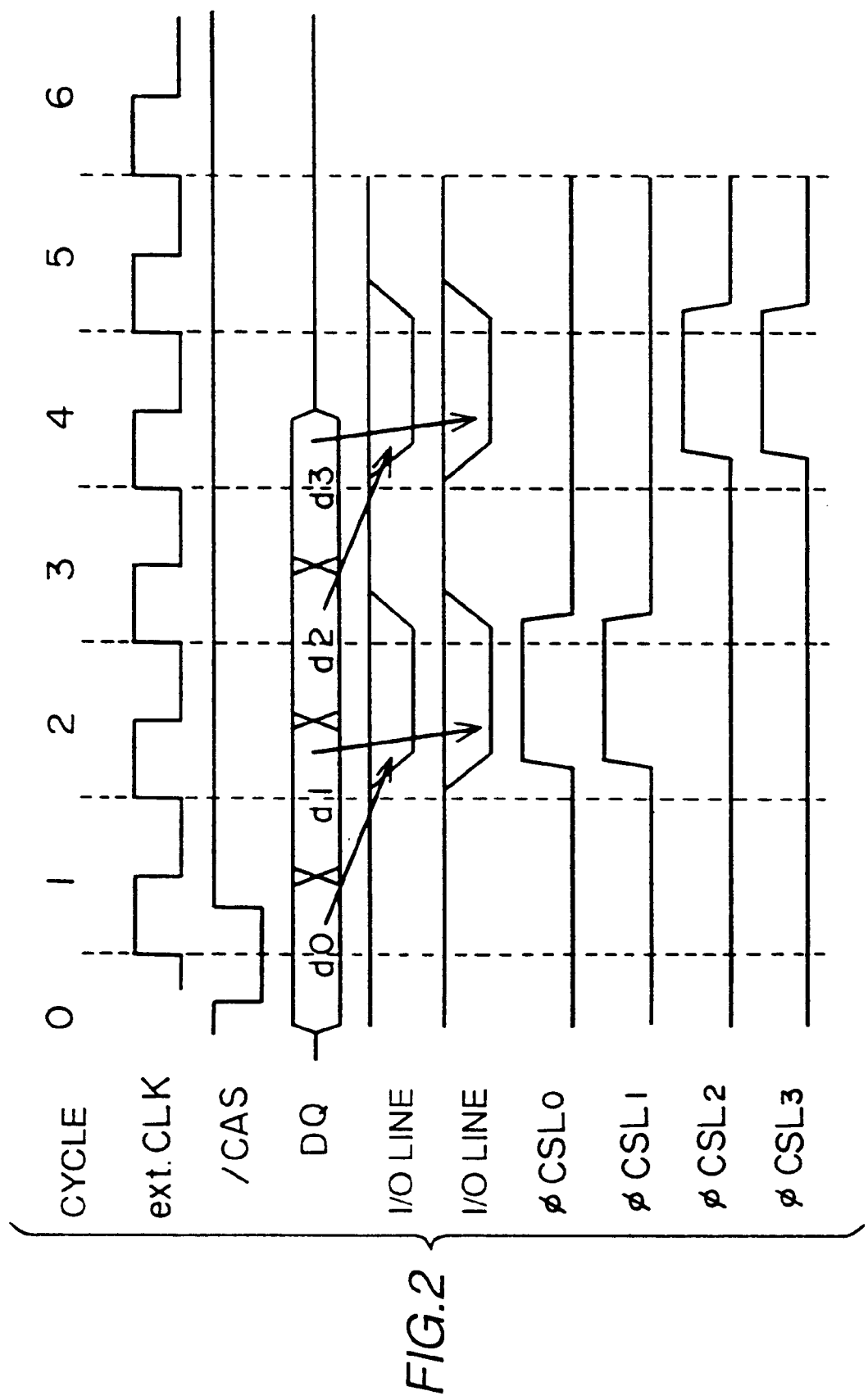
FIG. 2 is a timing chart showing operation of SDRAM 1000.

FIG. 2 is a timing chart showing successive writing operation (burst length=4) of the circuit shown in FIG. 1. The difference between the timing shown in FIG. 2 and the timing of writing operation of the conventional DRAM shown in FIG. 31 lies in that activation timing of column selection signals φCSL0 and φCSL1 and the like is delayed by one clock of the external clock signal. More specifically, column selection signals φCSL0 and φCSL1 and the like are activated at a timing for writing the second bit data of the 2-bit write data to be written simultaneously.

More specifically, at a rising edge of clock signal ext.CLK in cycle 1, when signal ext./CAS is activated at an "L" level and signal ext./WE is activated at an "L" level, column address signal Yb is incorporated and data d0 applied to data input/output terminal DQ at this point in time is incorporated as the first write data to write register 59a.

At the rising edge of clock signal ext.CLK in cycle 2, signal d1 applied to data input/output terminal DQ is incorporated to write register 59a' as the second bit write data. In response to activation of write buffer activation signals φWBA0 and φWBA1, the second bit data is output to the corresponding I/O line pair I/O0 and I/O line pair I/O1 (hereinafter, global I/O line pair GIO and local I/O line pair LIO0 are generically indicated as I/O line pair I/O0, and global I/O line pair GIO1 and local I/O line pair LIO1 are generically indicated as I/O line pair I/O1).

In response to the rising edge of clock signal ext.CLK in cycle 2, column selection signals φCSL0 and φCSL1 for selecting the corresponding memory cell columns in memory cell array banks A0 and A1 both attain an activated state ("H" level). In response thereto, column selection gate CSG which belongs to memory cell array bank A0 and connects bit line pair BLP0 connected to the selected memory cell and the corresponding local I/O line pair LIO0 is rendered conductive, and simultaneously column selection gate CSG which connects bit line pair BLP1 connected to the selected memory cell in memory cell array bank A1 and the corresponding local I/O line pair LIO1 is rendered conductive.

Through the operation above, externally applied data d0 and d1 are transmitted as complementary signals to the selected bit line pairs BLP0 and BLP1, respectively, whereby data is written into the selected memory cells. After column selection signals φCSL0 and φCSL1 are inactivated, local I/O line pairs LIO0 and LIO1 and global I/O line pairs GIO0 and GIO1 are equalized in response to activation of equalizing circuit activation signal φWEQA.

At the rising edge of clock signal ext.CLK in cycle 3, data d2 applied to data input/output terminal DQi is stored in write register 59a again.

At the rising edge of clock signal ext.CLK in cycle 4, data d3 applied to data input/output terminal DQ*i* is stored in write register 59*a*' as write data. Data d3 is output from write buffers 60*a* and 60*a*' to the corresponding global I/O line pairs GIO0 and GIO1.

As is the case in cycle 2, in response to the rising edge of clock signal ext.CLK in cycle 4, column selection signal φCSL2 selecting the corresponding memory cell column in memory cell array bank A0 and column selection signal φCSL3 selecting the corresponding memory cell column in memory cell array bank A1 are activated, whereby data d2 and d3 are written to the selected memory cells in memory cell array banks A0 and A1.

In response to the rising edge of clock signal ext.CLK in cycle 5, column selection signals φCSL2 and φCSL3 are inactivated. Thereafter, in response to activation of equalizing circuit activation signal φWEQA, local I/O line pairs LIO0 and LIO1 and global I/O line pairs GIO0 and GIO1 are equalized again.

This completes data writing operation with burst length of 4 in 2-bit prefetch operation.

The description above is based on the case where the least significant bit of the address signal is "0" and writing is carried out starting from memory cell array bank A0. When the least significant bit of the address signal is "1", writing is started with memory cell bank A1.

In the present embodiment, the selected bit line pairs BLP0 and BLP1 are not connected with the corresponding I/O line pairs until writing of the second bit data is initiated, so that difference in potential has not been generated in advance at the I/O line pair, especially the I/O line pair for writing the second bit data. Therefore, data writing can be performed without inverting the potential of the I/O line pair in data writing operation, thereby achieving high speed writing of data.

Figure 3:
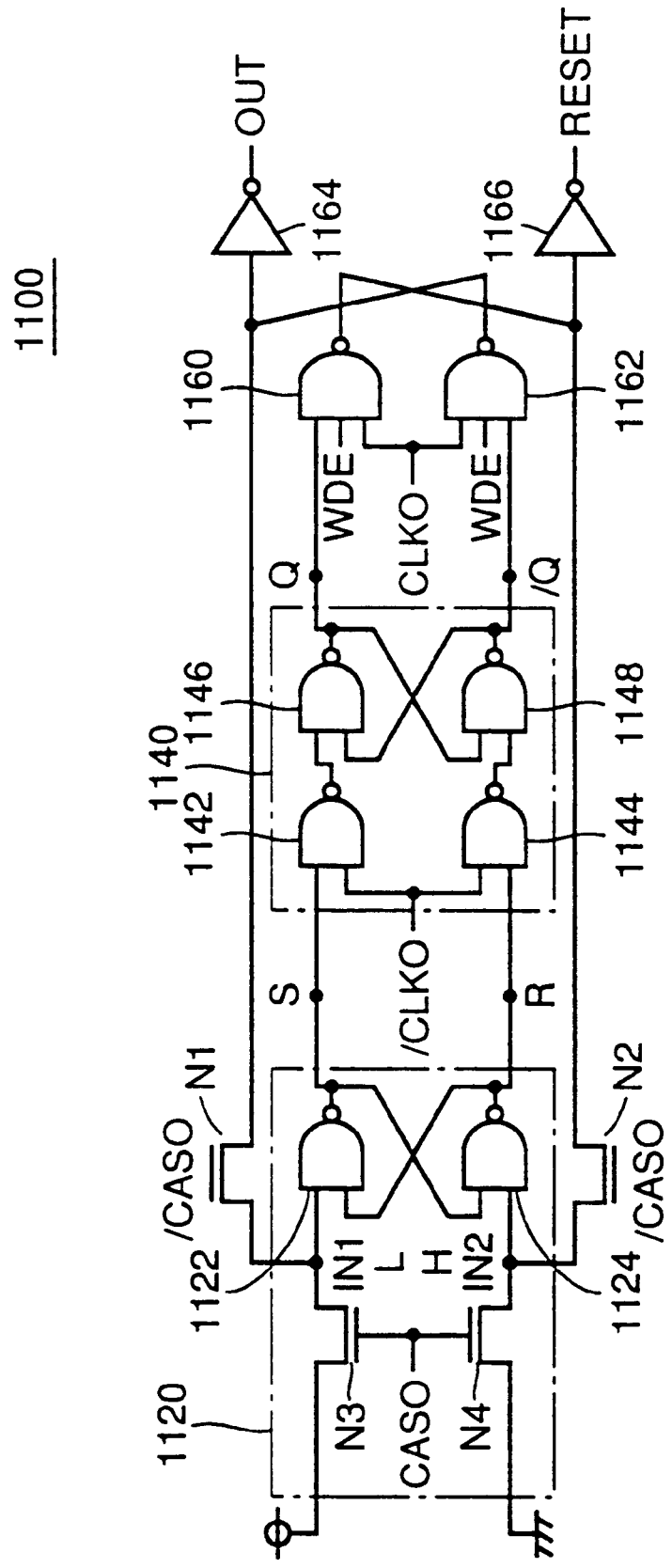
FIG. 3 is a circuit block diagram showing the structure of a column selecting operation control circuit 1100.

FIG. 3 is a schematic block diagram showing the structure of column selecting operation control circuit 1100 generating a trigger signal for applying column selection signals φCSL0 and φCSL1 and the like shown in FIG. 2.

Column selecting operation control circuit 1100 includes an SR flipflop circuit 1120 having the signal input timing to the input nodes thereof controlled by signals CAS0 and /CAS0, an SR flipflop circuit 1140 for receiving outputs of SR flipflop circuit 1120 and having the input timing controlled by signal /CLK0, a 3-input NAND circuit 1160 for receiving one output of SR flipflop 1140 and signals WDE and CLK, a 3-input NAND circuit 1162 for receiving the other output of SR flipflop 1140 and signals WDE and CLK, an inverter circuit 1164 for receiving an output of NAND circuit 1162 and applying a signal OUT, an inverter circuit 1166 for receiving an output signal of NAND circuit 1160 and applying signal Reset, an N channel MOS transistor N1 for receiving signal /CAS0 at the gate and connecting the output of NAND circuit 1162 and one input node IN1 of SR flipflop 1120, and an N channel MOS transistor N2 for receiving signal /CAS0 at the gate and connecting the output of NAND circuit 1160 and the other input node IN2 of SR flipflop circuit 1120.

SR flipflop circuit 1120 includes an N channel MOS transistor N3 for receiving signal CAS0 at the gate and connecting the potential of an "H" level and input node IN1, an N channel MOS transistor N4 for receiving signal CAS0 at the gate and connecting the potential of an "L" level and input node IN2, an NAND circuit 1122 having one input connected to input node IN1, and an NAND circuit 1124 having inputs connected to an output node of NAND circuit 1122 and input node IN2 and an output connected to the other input of NAND circuit 1122.

SR flipflop circuit 1140 includes an NAND circuit 1142 for receiving the output of NAND circuit 1122 and signals /CLK0 as inputs, an NAND circuit 1144 for receiving an output of NAND circuit 1124 and signal /CLK0 as inputs, an NAND circuit 1146 for receiving an output of NAND circuit 1142 as one input, and an NAND circuit 1148 for receiving outputs of NAND circuits 1144 and 1146 as inputs and having an output connected to the other input of NAND circuit 1146.

Here, the output node of NAND circuit 1122, i.e. one input node of NAND circuit 1142 is represented as S, and the output node of NAND circuit 1124, i.e. one input node of NAND circuit 1144 is represented as R.

In addition, the output node of NAND circuit 1146 is represented as Q and the output node of NAND circuit 1148 as /Q.

Now, brief description will be made on operation. FIG. 4 is a timing chart showing operation of column selecting operation control circuit 1100.

It is to be noted that signal CLK0 is an internal clock signal applied from first control signal generation circuit 62 based on the externally applied master clock signal ext.CLK and the timing thereof is the same as that of signal ext.CLK, as described above. Signal CAS0 is a signal activated when the timing of the externally applied control signal indicates writing operation and generated from first control signal generation circuit 62 in synchronization with signal CLK0.

In response to the rising edge of signal ext.CLK in cycle 1, internal clock signal CLK0 rises at time t0. Since external column strobe signal ext./CAS is activated at an "L" level to designate writing operation at the rising edge of signal ext.CLK in cycle 1, signal /CAS0 is also activated (attaining an "L" level) at time t0.

At time t1, internal clock signal CLK0 is at an "H" level, signal /CAS0 is at an "L" level, and signal WDE is at an "L" level. In response to signal /CAS0 attaining an "L" level, i.e. in response to signal CAS0 attaining an "H" level, N channel MOS transistors N3 and N4 are rendered conductive, whereby input node IN1 attains an "H" level and input node IN2 attains an "L" level. Therefore the potential levels of the output nodes of SR flipflop circuit 1120, i.e. the potential levels of nodes S and R attain "L" level and "H" level, respectively.

Since signal CLK0 is at an "H" level, i.e. signal /CLK0 is at an "L" level, NAND circuits 1142 and 1144 forming the input gates of SR flipflop circuit 1140 are inactivated. Therefore, assuming that the potential levels of output nodes Q and /Q of SR flipflop circuit 1140 are "H" and "L" levels at this point in time respectively, since signal WDE is at an "L" level at time t1, the outputs of NAND circuit 1160 and 1162 both attain an "H" level and an output signal OUT of inverter circuit 1164 and output signal Reset of inverter circuit 1166 both attain an "L" level.

At time t2 when signal CLK0 is at an "L" level and signal WDE is at an "H" level, the output signals of NAND circuits 1142 and 1144 forming the input gates of SR flipflop circuit 1140 change in accordance with the potential levels of input nodes S and R respectively. In response thereto, the potential levels of output nodes Q and /Q of SR flipflop circuit 1140 are reset, attaining "L" and "H" levels, respectively. Although signal WDE is at an "H" level, the output levels of NAND circuits 1160 and 1162 are at an "H" level because signal CLK0 is at an "L" level, and the output levels of signals OUT and Reset maintain an "L" level.

In response to the rising edge of clock signal ext.CLK in cycle 2, internal clock signal CLK0 attains an "H" level. Then, all the potentials of node /Q and signals CLK0 and WDE applied to NAND circuit 1162 attain an "H" level, so that the output level thereof changes to an "L" level and signal OUT changes to an "H" level. Signal Reset maintains an "L" level.

At time t4, in response to signal CLK0 attaining an "L" level, the output level of NAND circuit 1162 returns to an "H" level, and signal OUT attains an "L" level.

In response to signal OUT at an "H" level, i.e. in response to the output node of NAND circuit 1162 at an "L" level and the output node of NAND circuit 1160 at an "H" level, input nodes IN1 and IN2 of SR flipflop circuit 1120 attain "L" and "H" levels, respectively. In other words, the potential levels inverted from those applied to input nodes IN1 and IN2 in response to signal /CAS0 attaining an "L" level at time t0 are applied thereto. Therefore, when internal clock signal CLK0 attains an "L" level, i.e. signal /CLK0 attains an "H" level at time t4, the input potential levels opposite to those at time t0 are applied to input nodes S and R of SR flipflop circuit 1140. In other words, in response to signal /CLK0 attaining an "H" level, the potential levels of output nodes Q and /Q of SR flipflop circuit 1140 are inverted from those at time t2.

In response to the rising edge of signal ext.CLK in cycle 3, internal clock signal CLK0 attains an "H" level, and then the output levels of NAND circuits 1160 and 1162 attain "L" level and "H" level, opposite to the change at time t3. As a result, signal Reset attains an "H" level while signal OUT maintains an "L" level.

At time t6 in cycle 3, internal clock signal CLK0 attains an "L" level, and in response thereto the output level of NAND circuit 1160 attains an "H" level again, whereby signal Reset returns to an "L" level.

At time t6, the output levels of NAND circuits 1160 and 1162 are at "L" and "H" levels respectively, so that the potential levels of input nodes IN1 and IN2 of flipflop circuit 1120 attain "H" and "L" levels respectively. At the falling edge of signal CLK0, SR flipflop circuit 1140 receives at input nodes S and R the potential levels similar to those at time t1.

Through the operation above, it can be seen that the output levels of NAND circuits 1160 and 1162 change alternately every cycle of signal ext.CLK whenever the produced internal clock signal CLK0 changes from an "L" level to an "H" level in accordance with the change in external clock signal ext./CLK as long as signal WDE is at an "H" level.

FIG. 5 is a schematic block diagram showing the structure of a circuit for receiving output signals of OUT and Reset of column selecting operation control circuit 1100 shown in FIG. 3 and applying Y decoder activation signal ENCSL.

Signals OUT and Reset are applied to a latch circuit 1210, and an inverter circuit 1220 receiving an output of latch circuit 1210 outputs Y decoder activation signal ENCSL. More specifically, in response to signal OUT attaining an "H" level, signal ENCSL attains an "H" level and this state is held by latch circuit 1210. Thereafter, in response to signal Reset attaining an "H" level, the state of latch circuit 1210 is reset and signal ENCSL an "L" level. In other words, signal ENCSL makes a change similar to column selection signals φCSL0, φCSL1, and the like shown in FIG. 2.

FIG. 6 is a schematic block diagram showing a part of the structure of Y decoder group 53a in SDRAM 1100 shown in FIG. 1.

Y decoder group 53a includes an NAND circuit 532 for receiving Y decoder activation signal ENCSL and column address signals Y1–Yk and an inverter circuit 534 for receiving an output of NAND circuit 532 and applying signal φCSL0, and an NAND circuit 536 for receiving Y decoder activation signal ENCSL and internal column address signals /Y1, Y2–Yk and an inverter circuit 538 for receiving an output of NAND circuit 536 and applying column selection signal φCSL1.

When signal ENCSL is activated (attaining an "H" level) and all the internal column address signals Y1–Yk are "1", column selection signal φCSL0 is activated. Meanwhile, column selection signal φCSL1 is activated when signal ENCSL is activated and internal column address signal Y1 is "0" and all of the internal column address signals Y2–Yk are "1".

Therefore, as shown in FIG. 2, column selection signals φCSL0 and φCSL1 are activated in cycle 2, and change to the inactivated state in cycle 3.

Column selection signals φCSL2 and φCSL3 are also activated in cycle 4 and inactivated in cycle 5 as shown in FIG. 2 by signal ENCSL produced by signals OUT and Reset shown in FIG. 4.

Embodiment 2

Figure 11:
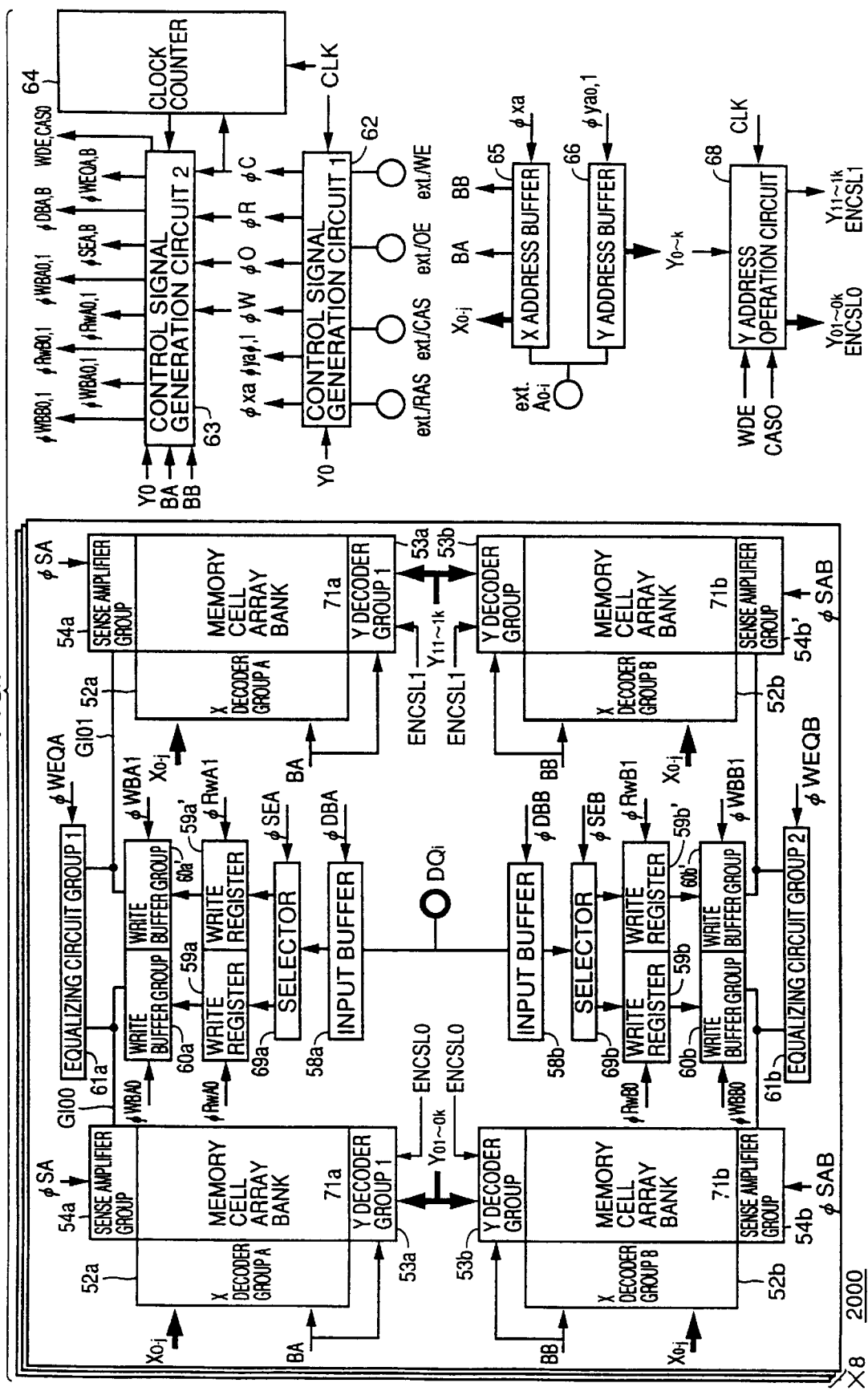
FIG. 11 is a schematic block diagram showing the structure of an SDRAM 2000 in accordance with a second embodiment of the present invention.

FIG. 11 is a schematic block diagram showing the structure of an SDRAM 2000 in accordance with a second embodiment of the present invention. SDRAM 2000 differs from SDRAM 1000 in accordance with the first embodiment in that Y address operation circuit 68 receiving internal column address signals Y0–Yk from Y address buffer 66 applies a Y decoder activation signal ENCSL0 and internal column address signals Y01–Y0k for memory cell array bank A0 or B0 and a Y decoder activation signal ENCSL1 and internal column address signals Y1–Y1k for memory cell array bank A1 or B1, independently from each other. The identical portions are labeled with the identical reference characters and description thereof will not be repeated.

Figure 12:
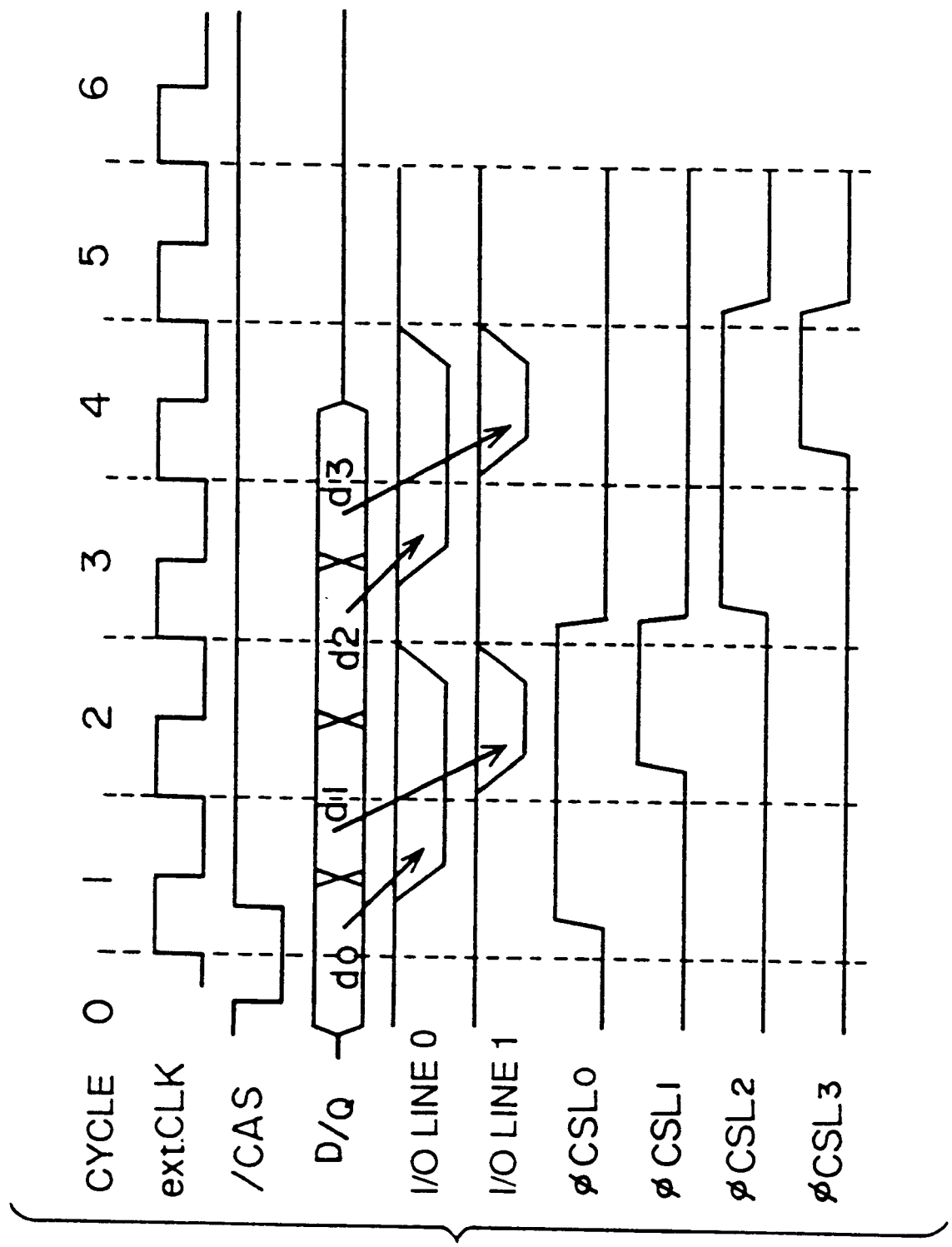
FIG. 12 is a timing chart showing operation of SDRAM 2000.

FIG. 12 is a timing chart showing operation of SDRAM 2000 in accordance with the second embodiment. The operation of SDRAM 2000 differs from that of SDRAM 1000 in the first embodiment shown in FIG. 2 in that, in 2-bit prefetch operation, column selection signals φCSL1 and the like for writing the second bit data are activated delayed by one clock cycle period from column selection signal φCSL0 for writing the first bit data.

The operation will be described in detail below. In the description below, it is assumed that memory cell array bank A is selected, the least significant bit of the address signal externally applied in data writing operation is "0" and a head data (data of the first bit to be written) of the data is applied to memory cell array bank A0.

At the rising edge of clock signal ext.CLK in cycle 1, external column address strobe signal /CAS and writing operation control signal ext./WE are both at "L" level, thereby designating the writing operation mode. At this point in time, data signal d0 applied to data input/output terminal DQ is stored in write register 59a as the head data. Y address operation circuit 68 is responsive to the externally applied column address and applies activated Y decoder activation signal ENCSL0 and corresponding internal column address signals Y01–Y0k to Y decoder group 53a. Y decoder group 53a outputs the activated column selection signal φCSL0 to bit line pair BLP0 corresponding to the applied internal column address signals Y01–Y0k.

Write buffer group 60a is responsive to activation of write buffer activation signal φWBA0 output from second control signal generation circuit 64 and initiates output of write data to the corresponding global I/O line pair GIO0. The write data is transmitted to the selected memory cell through the selected global I/O line pair GIO0, local I/O line pair LIO0 and bit line pair BLP0.

Through the operation above, the first bit write data is written to the selected memory cell in memory cell array bank A0.

At the rising edge of clock signal ext.CLK in cycle 2, the signal applied to data input/output terminal DQ is stored in write register 59a' as the second bit data. Y address operation circuit 68 is responsive to the rising edge of signal ext.CLK in cycle 2 and outputs the activated Y decoder activation signal ENCSL1 to memory cell array bank A1. Y decoder group 53a outputs the activated column selection signal φCSL1 to column selection gate CSG of bit line pair BLP1 corresponding to the applied internal column address signals Y11–Y1k. In response thereto, the second bit write data applied from write buffer group 60a' is transmitted through the selected global I/O line pair GIO1, local I/O line pair LIO1 and bit line pair BLP1 and written in the selected memory cell in memory cell array bank A1.

In response to the rising edge of signal ext. CLK in cycle 3, column selection signals φCSL0 and φCSL1 are both inactivated, and second control generation circuit 63 activates equalizing circuit activation signal φWEQA. In response thereto, global I/O line pairs GIO0 and GIO1 and local I/O line pairs LIO0 and LIO1 have their potentials equalized.

As in cycles 1 and 2, at the rising edge of signal ext.CLK in cycle 3, the data applied to data input/output terminal DQ is incorporated as the third bit write data d2 and is written by activation of the corresponding column selection signal φCSL2 for memory cell array bank A0.

In response to the rising edge of signal ext.CLK in cycle 4, the fourth bit write data d3 is incorporated, the activated column selection signal φCSL3 is output to the corresponding memory cell column in memory cell array bank A1, and the fourth bit data is written.

In response to the rising edge of signal ext.CLK in cycle 5, column selection signals φCSL2 and φCSL3 are both inactivated and equalizing circuit activation signal φWEQA is activated again.

In response thereto, equalizing operation is performed again for the global I/O line pair and the local I/O line pair.

While the description above relates to an example where the least significant bit of the address signal applied externally in writing operation is at "0" level, when the least significant bit of the address signal is "1", writing operation is carried out first for memory cell array bank A1 and thereafter data writing operation is performed for memory cell array banks A0 and A1 alternately.

Figure 16:
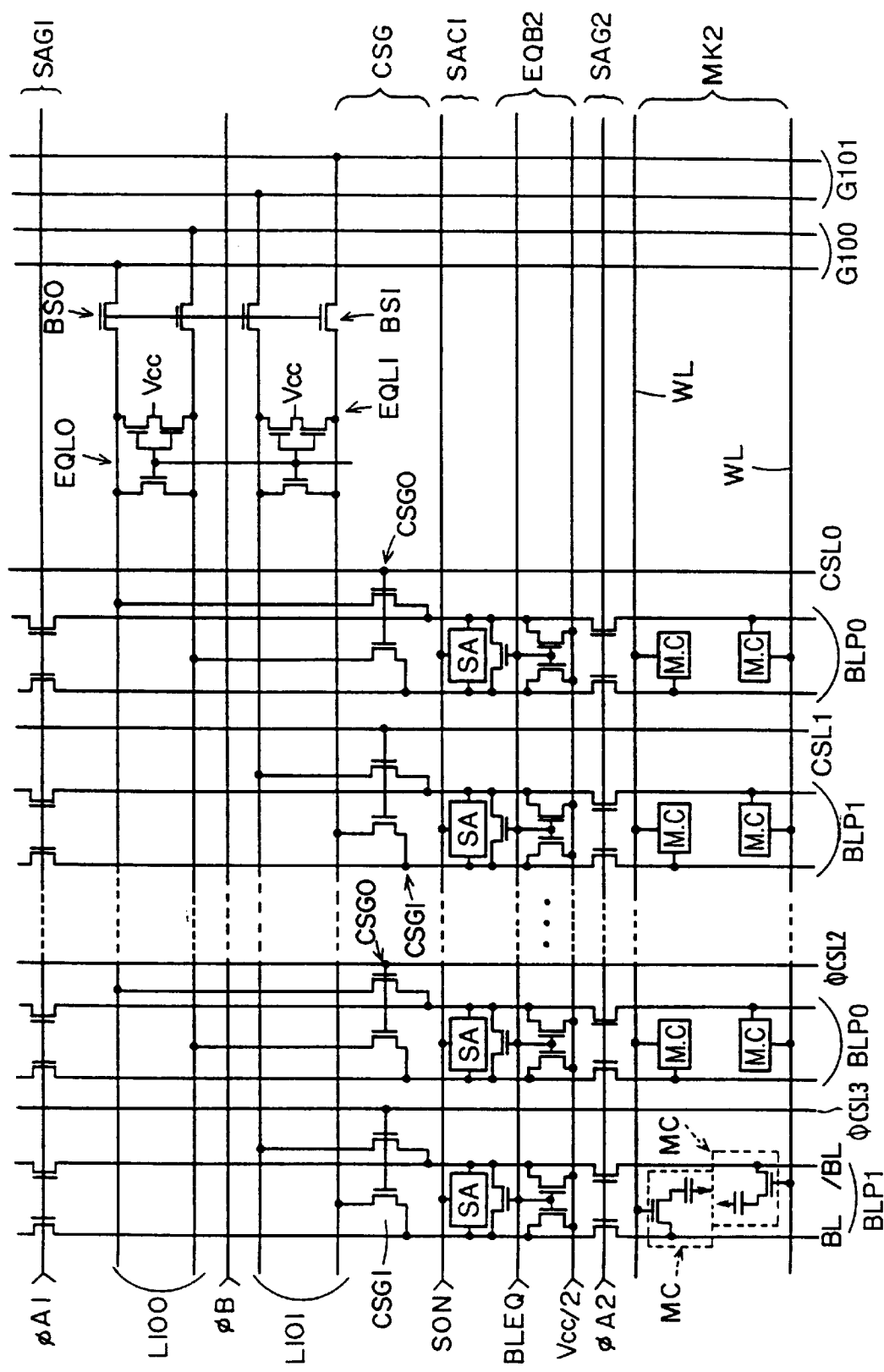
FIG. 16 is a circuit block diagram showing the structure of a portion related to one 32K-bit memory array of SDRAM 2000.

FIG. 16 is a circuit diagram showing the structure of 32K-bit memory array MK in 2M-bit memory array MA in SDRAM 2000 shown in FIG. 11, comparable to FIG. 9.

The structure differs from that of SDRAM 1000 of the first embodiment shown in FIG. 9 in that column selection line CSL0 for controlling a column selection gate CSG0 of bit line pair BLP0 belonging to memory cell array bank A0 and a column selection line CSL1 for controlling a column selection gate CSG1 of bit line pair BLP1 belonging to memory cell array bank A1 are provided separately to be controlled independently from each other.

The rest of the structure is similar to that in the first embodiment shown in FIG. 9, and the identical portions are labeled with the identical reference characters and description thereof will not be repeated.

Figure 13:
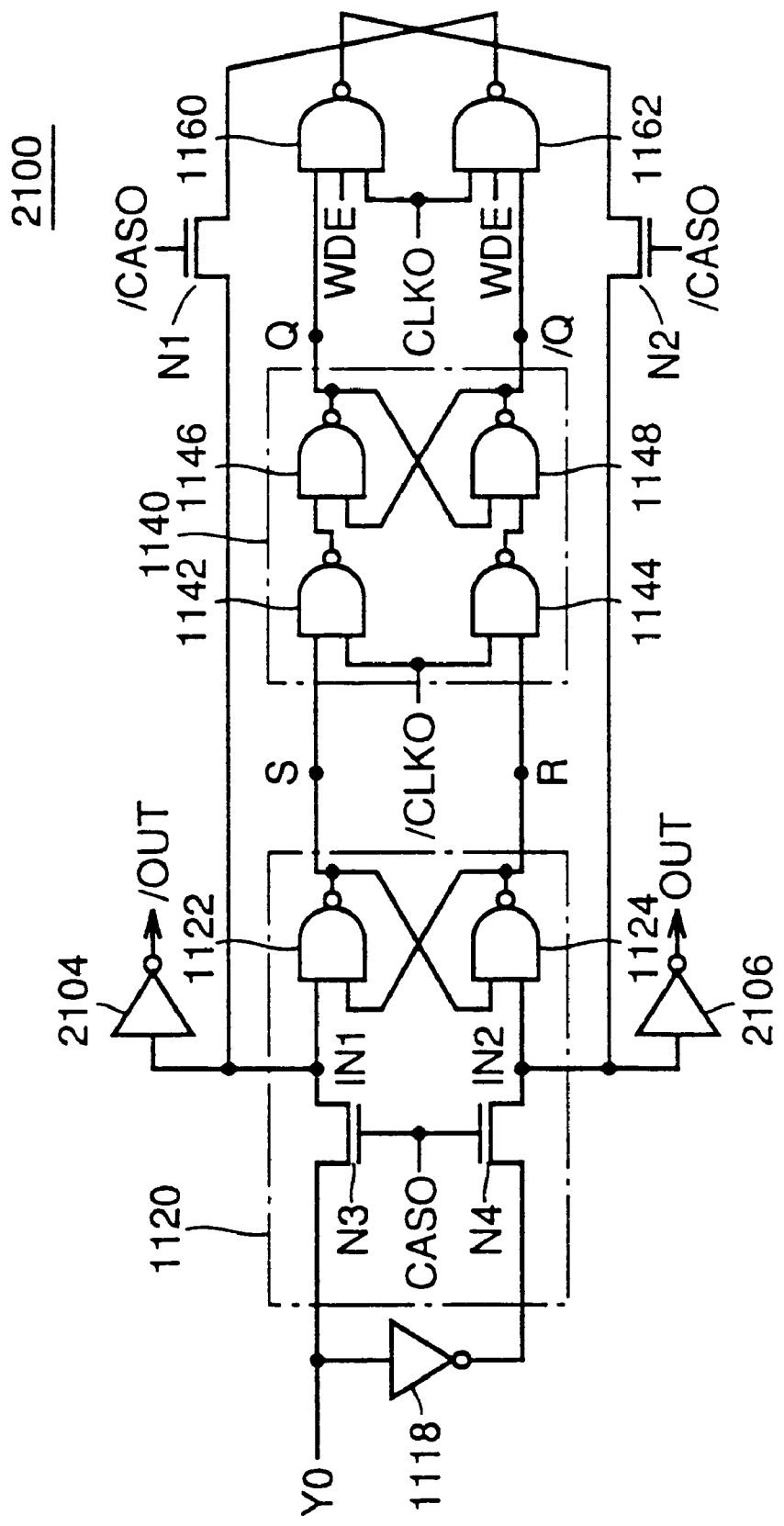
FIG. 13 is circuit block diagram showing the structure of a column selecting operation control circuit 2100.

FIG. 13 is a schematic block diagram showing the structure of a column selecting operation control circuit 2100 included in Y address operation circuit 68 shown in FIG. 11 and determining the timing to activate Y decoder activation signals ENCSL0 and ENCSL1, comparable to FIG. 3 showing column selecting operation control circuit 1100 of the first embodiment.

Y address operation circuit 68 includes column selecting operation control circuits 1100 and 2100.

The structure of column selecting operation control circuit 2100 is different from that of column selecting operation control circuit 1100 in the following two points.

First, an input signal applied to column selecting operation control circuit 2100 changes in accordance with the value of least significant bit Y0 of the externally applied column address signal, while the level of the input signal of column selecting operation control circuit 1100 is fixed.

Secondly, the node at which the output signal thereof is obtained is the same as the input node of the SR flipflop circuit on the input side. More specifically, column selecting operation control circuit 2100 includes an inverter circuit 2104 having an input connected to input node IN1 of SR flipflop circuit 1120 and applying signal /OUT and an inverter circuit 2106 having an input connected to node IN2 and applying signal OUT.

Input node IN1 in SR flipflop circuit 1120 at a first stage of column selecting operation control circuit 2100 receives the least significant bit Y0 of the column address signal through N channel MOS transistor N3 controlled by signal CAS0. On the other hand, the other input node IN2 of SR flipflop circuit 1120 receives the inverted version of signal Y0 by inverter circuit 1118 through N channel MOS transistor N4 controlled by signal CAS0. Therefore, the output signals of SR flipflop circuit 1120, i.e. the signal levels applied to input node S and R of SR flipflop circuit 1140 are "H" and "L" levels, replacing with each other in accordance with the value of the least significant bit of the column address signal.

Since the output signals of column selecting operation control circuit 1100 are applied corresponding to the potential levels of the output nodes of NAND circuits 1160 and 1162, the output signals are activated starting from cycle 2 after signal /CAS0 is activated in cycle 1.

In contrast, in column selecting operation control circuit 2100, output signals OUT and /OUT are applied in accordance with the potential levels of input nodes IN1 and IN2 of SR flipflop circuit 1120, and therefore in cycle 1 signal /CAS0 is activated (attaining an "L" level) and also output signal OUT or /OUT is activated.

FIG. 14 is a timing chart showing the operation of column selecting operation control circuit 2100 shown in FIG. 13.

In response to the rising edge of clock signal ext. CLK in cycle 1, internal clock signal CLK0 is activated. Meanwhile, in response to external column strobe signal ext./CAS at an "L" level, signal /CAS0 attains a "L" level, and therefore, signal CAS0 attains an "H" level. Assuming that the least significant bit of the address signal is "0", the signals of "L" and "H" levels are applied to input nodes IN1 and IN2 of SR flipflop circuit 1120 in response to activation of signal CAS0, respectively. In response thereto, signal /OUT applied from inverter circuit 2104 changes to an "H" level, and signal OUT applied from inverter circuit 2106 maintains an "L" level.

At time t2, in response to the fall of internal clock signal CLK0 to an "L" level, output signals Q and /Q of SR flipflop circuit 1140 change to "L" and "H" levels, respectively. Although write decode enable signal WDE is at an "H" level at this point in time, the output levels of NAND circuits 1160 and 1162 are both at an "H" level because signal CLK is at an "L" level. Therefore, when signal /CAS0 attains an "H" level and N channel MOS transistors N1 and N2 are rendered conductive, the input potential levels of inverter circuits 2104 and 2106 both obtain an "H" level, whereby signals OUT and /OUT both attain an "L" level.

In response to the rising edge of signal ext.CLK in cycle 2, internal clock signal CLK0 attains an "H" level. In response thereto, NAND circuits 1160 and 1162 apply signals of "H" and "L" levels in accordance with the output signals of SR flipflop circuit 1140, respectively. As a result, signal OUT changes from an "L" level to an "H" level, and signal /OUT maintain an "L" level. In addition, in accordance with the change of internal clock signal CLK to an inactivated state, the output signal levels of NAND circuits 1160 and 1162 both attain an "H" level, and in response thereto output signal OUT returns to an "L" level and signal /OUT maintains an "L" level.

Through the operation above, signal /OUT changes to an "H" level to form a pulse in cycle 1, and signal OUT changes to an "H" level to form a pulse in cycle 2.

Thereafter, signals OUT and /OUT alternately change to an "H" level in accordance with the change in external clock signal ext. CLK during the period signal WDE is activated.

FIG. 15 is a schematic block diagram showing the structure of Y decoder activation signal generation circuits 682 and 684 included in Y address operation circuit 68 shown in FIG. 11.

Y decoder activation signal generation circuit 682 includes a latch circuit 682a for receiving output signal /OUT of column selecting operation control circuit 2100 shown in FIG. 13 and output signal Reset from column selecting operation control circuit 1100 shown in FIG. 3, and an inverter circuit 682b for receiving an output signal of latch circuit 682a and applying signal ENCSL0.

Meanwhile, Y decoder activation signal generation circuit 684 includes a latch circuit 684a for receiving signals OUT and Reset, and an inverter circuit 684b for receiving an output of latch circuit 684a and applying signal ENCSL1.

Y decoder activation signal generation circuit 682 is responsive to activation of signal /OUT and applies active signal ENCSL0 in cycle 1 shown in FIG. 14, and is responsive to activation of signal Reset to inactivate output signal ENCSL0 in cycle 3. Y decoder activation signal generation circuit 684 is responsive to activation of signal OUT to activate signal ENCSL1 to output in cycle 2, and is responsive to activation of signal Reset to inactivate signal ENCSL1 in cycle 3.

Through the operation above, changes of column selection signals φCSL0 and φCSL1 as shown in FIG. 12 are achieved.

Since similar cycles are repeated, signals φCSL2 and φCSL3 follow the changes as shown in FIG. 12 corresponding to signals ENCSL0 and ENCSL1 in a similar manner.

Since SDRAM 2000 in the second embodiment makes connection between the I/O line pair and the corresponding bit line pair in accordance with the timing chart shown in FIG. 12, the potential level of the I/O line pair for transmitting the second bit write data does not change during writing operation of the first bit data in accordance with the stored information in the memory cell at which the writing operation is to be carried out.

Therefore, in data writing operation, there is no need for inverting the potential level of the I/O line pair with great parasitic capacitance and the like in accordance with the value of the write data, thereby allowing high speed writing operation.

Embodiment 3

Figure 31:
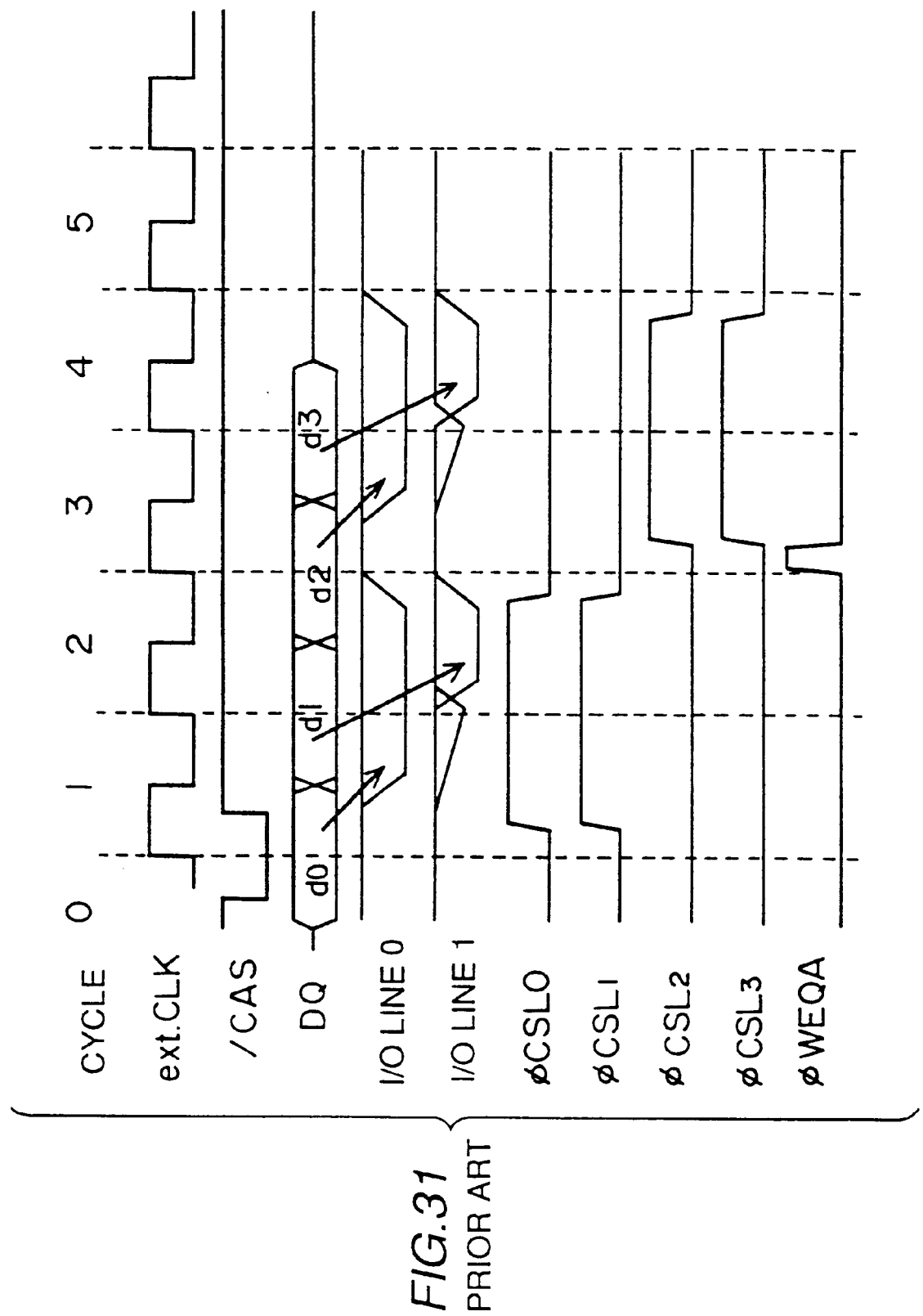
FIG. 31 is a timing chart showing successive writing operation of 2-bit prefetch operation of the conventional SDRAM.

In the conventional SDRAM shown in FIG. 31, operation to equalize the I/O line pair is performed every two cycles. As a result, in cycle 1 when operation to write the first bit data is performed, the potential level of the I/O line pair used for writing of the second bit data undesirably changes.

More specifically, although the I/O line pair used for writing the second bit data is connected to the corresponding bit line pair BLP1, the potential level of the I/O line pair changes in accordance with the potential difference already exiting at the connected bit line pair BLP1 because the second bit data has not yet been output to the I/O line pair.

Consequently, when the second bit data is applied to the I/O line pair in cycle 2, the potential of I/O line pair 1 must be inverted again if the data opposite to the already changed potential level of I/O line pair 1 is to be written, causing delay in time for writing operation.

In a third embodiment, the I/O line pair is equalized every cycle in response to the rising edge of signal ext.CLK after writing operation mode is designated in order to solve the problem above.

It is now assumed that an SDRAM of the third embodiment is basically similar in structure to SDRAM 1000 of the first embodiment shown in FIG. 1. SDRAM 1000 in the first embodiment differs from SDRAM in the third embodiment in the timing to output equalizing circuit activation signal φWEQA from the second control signal generation circuit 63.

FIG. 17 is a timing chart showing operation of the SDRAM in accordance with the third embodiment.

In response to the rising edge of signal ext.CLK in cycle 1, data d0 is incorporated and column selection signals φCSL0 and φCLS1 are activated similarly to the conventional example shown in FIG. 31. At this time, I/O line pairs GIO0 and LIO0 used for writing the first bit data have the potential levels already changed corresponding to the value of the first bit data. In contrast, I/O line pairs GIO1 and LIO1 used for writing the second bit data have the potential levels beginning to change in accordance with the potential difference already existing at the corresponding bit line pair.

In response to the rising edge of signal ext.CLK in cycle 2, second control signal generation circuit 64 applies equalizing circuit activation signal φWEQA, and in response thereto I/O line pairs GIO0, LIO0 and GIO1, LIO1 are equalized. Therefore, since I/O line pairs GIO1 and LIO1 are both equalized to return to the initial state, the potentials of I/O line pairs GIO1 and LIO1 need not be inverted when the second bit data is written. As a result, the problem of reduction in speed of writing operation associated with the conventional example can be solved.

Although the I/O line pair is equalized while maintaining the connection between bit line pair BLP0 and local I/O line pairs LIO0 and LIO1, the first bit data is not destroyed since the potential difference corresponding to the first bit data is latched by the sense amplifier.

In order to realize the signal change in accordance with the timing chart as shown in FIG. 17, column selection line CSL can be shared by two bit line pairs, i.e. bit line pair BLP0 belonging to memory cell array bank A0 and bit line pair BLP1 belonging to memory cell array bank A1, providing an advantage of reduction in number of column selection lines as compared to the second embodiment as shown in FIG. 16.

FIG. 18 is a schematic block diagram showing the structure of a circuit 700 for generating φWEQA shown in FIG. 17. Circuit 700 is included in second control signal generation circuit 63 in the structure of SDRAM shown in FIG. 1. Circuit 700 includes a delay circuit 702 for receiving write decode enable signal WDE, a delay circuit 704 for receiving internal clock signal CLK0, an inverter circuit 706 for receiving an output of delay circuit 704, an AND circuit 708 for receiving signal CLK0 and an output of inverter circuit 706 and an AND circuit 710 for receiving outputs of delay circuit 702 and AND circuit 708 and applying signal φWEQA.

In the structure above, delay circuit 704, inverter circuit 706 and AND circuit 708 function as circuit for applying a signal with a prescribed pulse length in response to the rising edge of signal CLK0.

AND circuit 710 controls whether or not the signal with the prescribed pulse length is output as signal φWEQA. More specifically, only during the period when signal WDE is activated at an "H" level and the potential of one input node of AND circuit 710 through delay circuit 702 is at an "H" level, equalizing circuit activation signal φWEQA with the prescribed pulse length is applied in response to the rising edge of signal CLK0.

It should be noted that delay circuit 702 is inserted into circuit 700 to delay the timing of change in signal WDE so that signal φWEQA is surely output in cycle 5 shown in FIG. 17.

Embodiment 4

In Embodiment 3, the I/O line pair is equalized every clock cycle during writing operation. However, as described above, equalizing operation is performed every cycle because the potential levels of corresponding I/O line pair GIO1 and LIO1 must be initialized in performing operation of writing the second bit.

Therefore, there is no need to equalize both I/O line pairs I/O0 and I/O1 every cycle, and it is sufficient to equalize only the I/O line pair used for writing the second bit data, i.e. I/O line pair I/O1.

In the fourth embodiment, therefore, I/O line pair I/O0 and I/O line pair I/O1 can be equalized independently.

Figure 19:
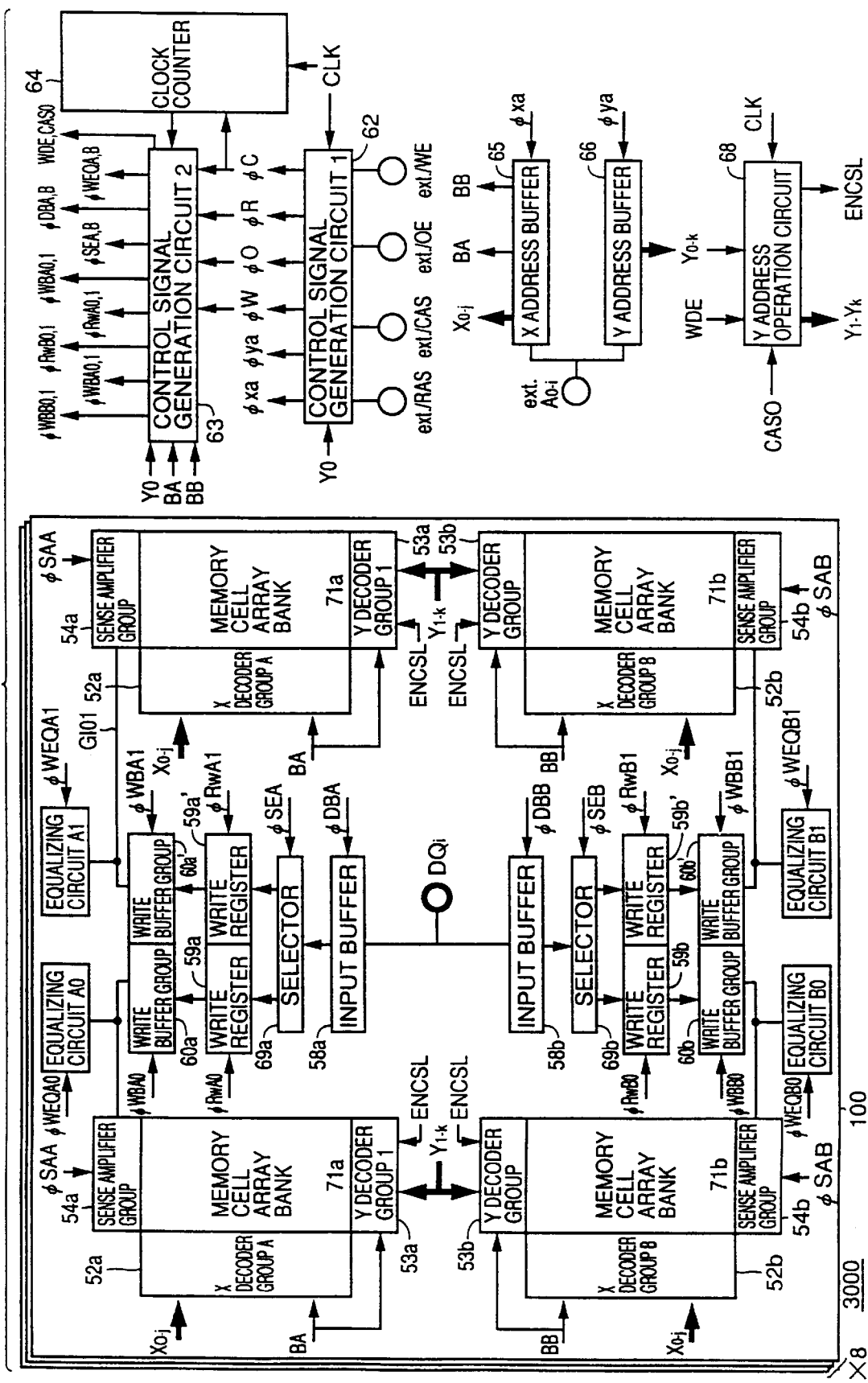
FIG. 19 is a schematic block diagram functionally showing the structure of an SDRAM 3000 in accordance with a fourth embodiment of the present invention.

FIG. 19 is a schematic block diagram showing the structure of an SDRAM 3000 in accordance with the fourth embodiment.

The structure of SDRAM 3000 differs from that of SDRAM 1000 in the first embodiment in that equalizing circuit groups are provided individually for I/O line pair 0 corresponding to memory cell array bank A0 and I/O line pair 1 corresponding to memory cell array bank A1, thereby allowing independent equalizing operation.

Therefore, different equalizing circuit activation signals φWEQA0 and φWEQA1 are applied from second control signal generation circuit 64, corresponding to respective memory cell array banks.

The structure described above is provided similarly for memory cell array banks B0 and B1. The identical portions are labeled with the identical reference numerals and description thereof will not be repeated.

Figure 20:
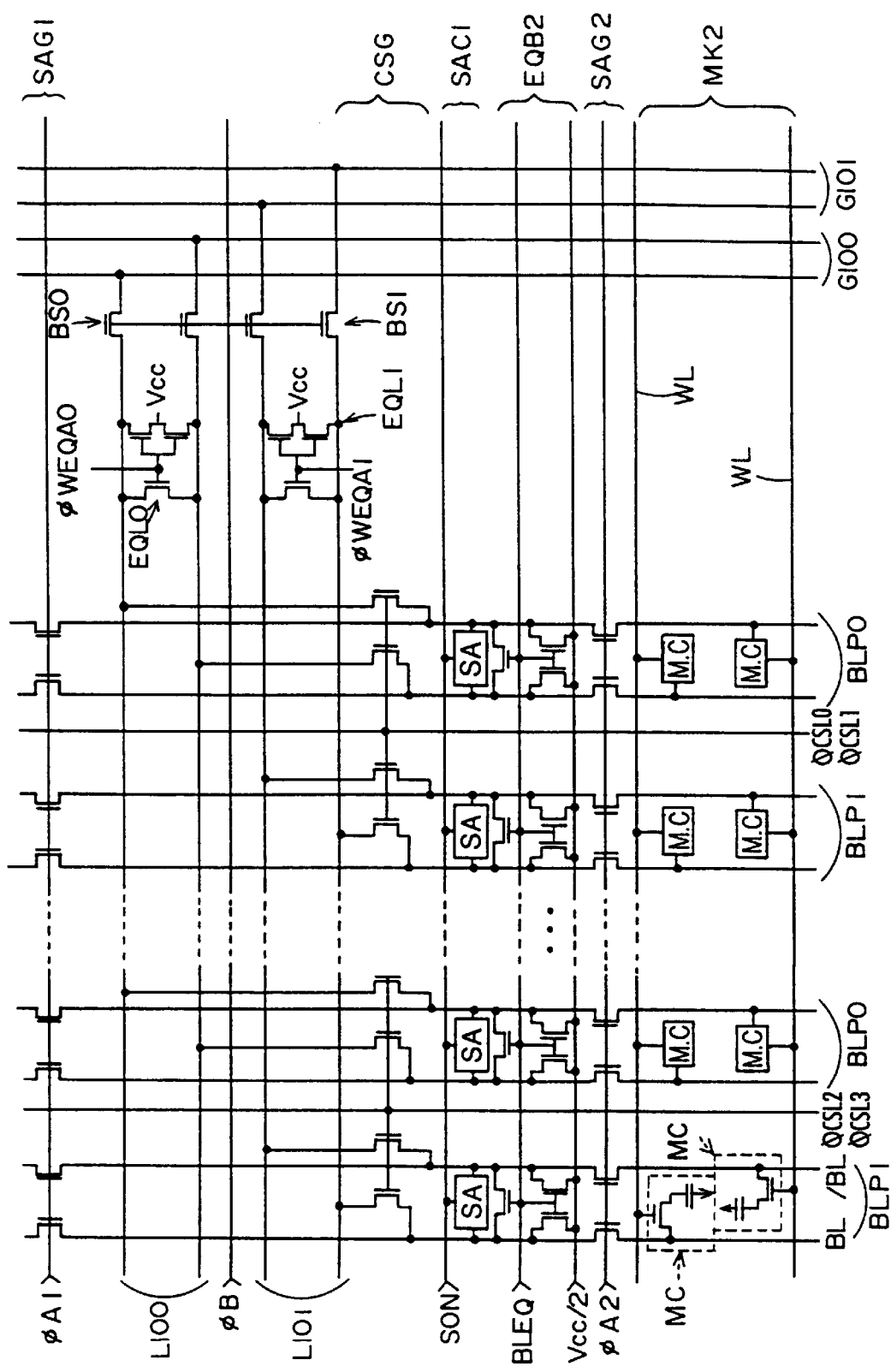
FIG. 20 is a circuit block diagram showing the structure of a portion related to one 32K-bit memory array of SDRAM 3000.

FIG. 20 is a partially omitted circuit block diagram showing a portion related to one 32K-bit memory array MK in SDRAM 3000 of the first embodiment, comparable to FIG. 9.

The structure thereof differs from the structure of SDRAM 1000 in the first embodiment shown in FIG. 9 in that an equalizing circuit for local I/O line pair LIO0 corresponding to memory cell array bank A0 is controlled by signal φWEQA0 and an equalizing circuit for local I/O line LIO1 corresponding to memory cell array bank A1 is controlled by equalizing signal φWEQA1.

Figure 21:
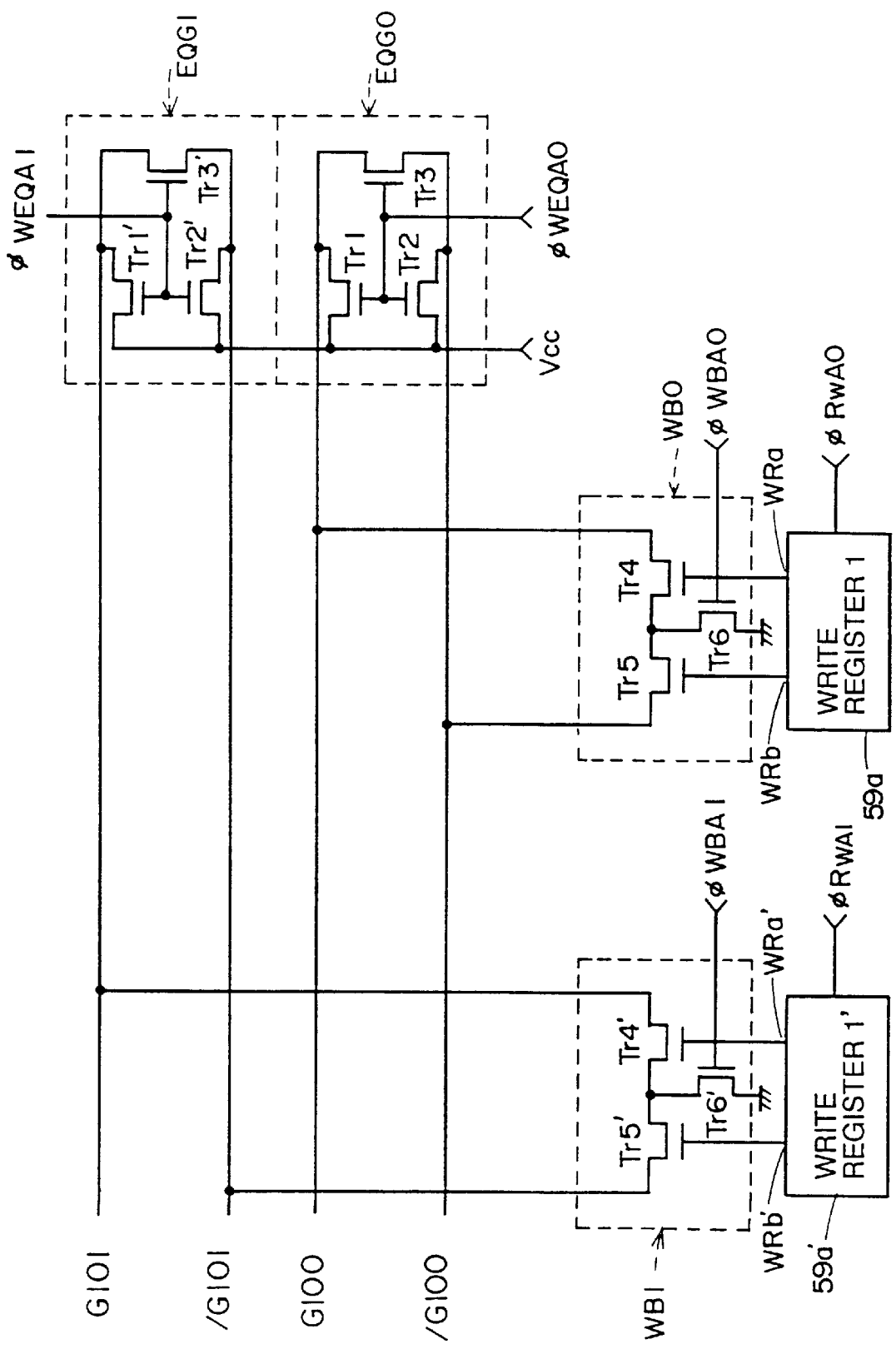
FIG. 21 is a circuit block diagram showing the structure of a portion related to writing operation of SDRAM 3000.

FIG. 21 is a circuit block diagram showing a specific structure of a portion related to writing operation of SDRAM 3000, comparable to FIG. 10.

The circuit differs from the corresponding circuit in SDRAM 1000 shown in FIG. 10 in that a circuit for equalizing global I/O line pair GIO0 corresponding to the selected memory cell in memory array bank A0 is controlled by signal φWEQA0 and a circuit for equalizing global I/O line pair GIO1 corresponding to the selected memory cell in memory cell array bank A1 is controlled by signal φWEQA1.

The structure above allows I/O line pair I/O0 and I/O1 in SDRAM 3000.

Figure 22:
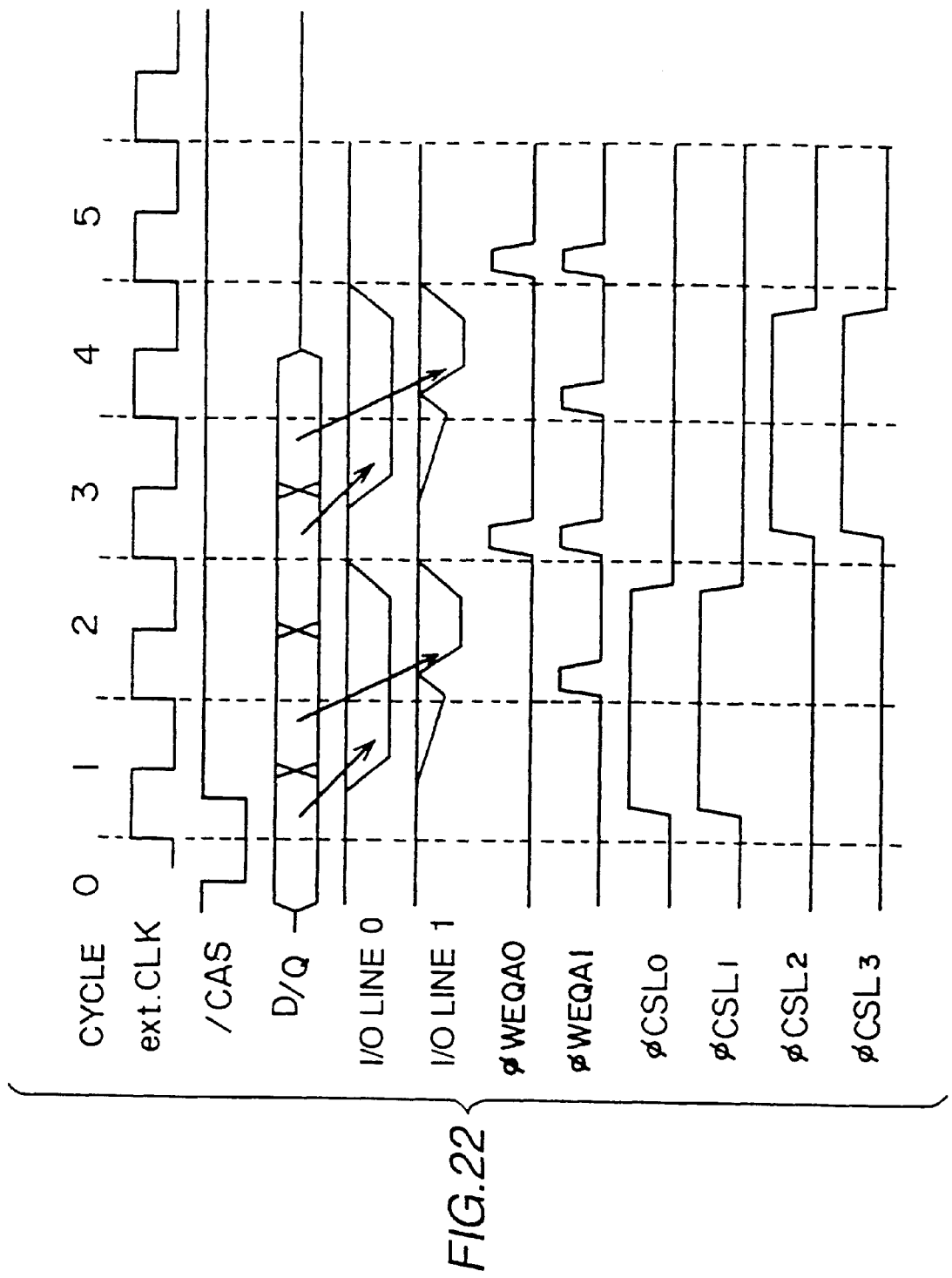
FIG. 22 is a timing chart showing operation of SDRAM 3000.

FIG. 22 is a timing chart showing operation of SDRAM 3000.

In response to the rising edge of signal ext. CLK in cycle 1, the first bit data d0 to be written is incorporated and the signal corresponding to I/O line pair I/O0 is applied. Meanwhile, column selection signals φCSL0 and φCSL1 selecting the selecting the corresponding memory cell columns in memory cell array banks A0 and A1 are both activated.

In response to the writing edge of signal ext.CLK in cycle 2, the second bit data is incorporated and equalizing signal φWEQA1 is activated, thereby equalizing the potential levels of I/O line pair I/O1 used for writing the second bit data. Next, the corresponding data is output to I/O line pair I/O1, and the data is written in the selected memory cell for the second bit.

In response to the rising edge of signal ext.CLK in cycle 3, read data d2 of the third bit is incorporated, and simultaneously equalizing circuit activation signals φWEQA0 and φWEQA1 are both activated, thereby performing equalizing operation for all the I/O line pairs corresponding to memory cell array banks A0 and A1. Furthermore, column selection signals φCSL2 and φCSL3 are both activated for selecting the corresponding columns in memory cell array banks A0 and A1, which columns include the memory cells where the third bit data and fourth bit data are to be written. In cycle 3, the third bit data is written in the selected memory cell in memory cell array bank A0.

In cycle 4, the fourth bit data is incorporated, and the fourth bit data is written after the I/O line pair used for writing the data is equalized.

In response to the rising edge of signal ext. CLK in cycle 5, column selection signals φCSL2 and φCSL3 which have selected the columns including in the memory cells for the third and fourth bits are both inactivated and equalizing signals φWEQA0 and φWEQA1 are both activated. As a result, equalizing operation is performed for the I/O line pairs corresponding to memory cell array banks A0 and A1, which completes writing operation for one burst length.

In SDRAM circuit 3000 of the fourth embodiment, the I/O line pairs used for writing data of the second and fourth bits and the like are equalized every clock cycle as described above. Consequently, even though the potential difference between the I/O lines is changed in accordance with the potential difference already existing in the bit line pair connected thereto during writing of the first and third bit data, data writing can be performed without inverting the potential difference, whereby no extra time is required for writing operation.

In addition, achievement of operation of SDRAM 3000 in the fourth embodiment only requires two sets of signal interconnections for independently transmitting equalizing signals φWEQA0 and φWEQA1 controlling equalizing operation of respective local I/O line pairs and global I/O line pairs, minimizing increase in signal interconnection.

FIGS. 23, 24, 26 and 27 are circuit diagrams showing the structure of the circuits for generating signals φWEQA0 and φWEQA1 shown in FIG. 22. Now, the structure and operation of the circuits will be described below.

Figure 23:
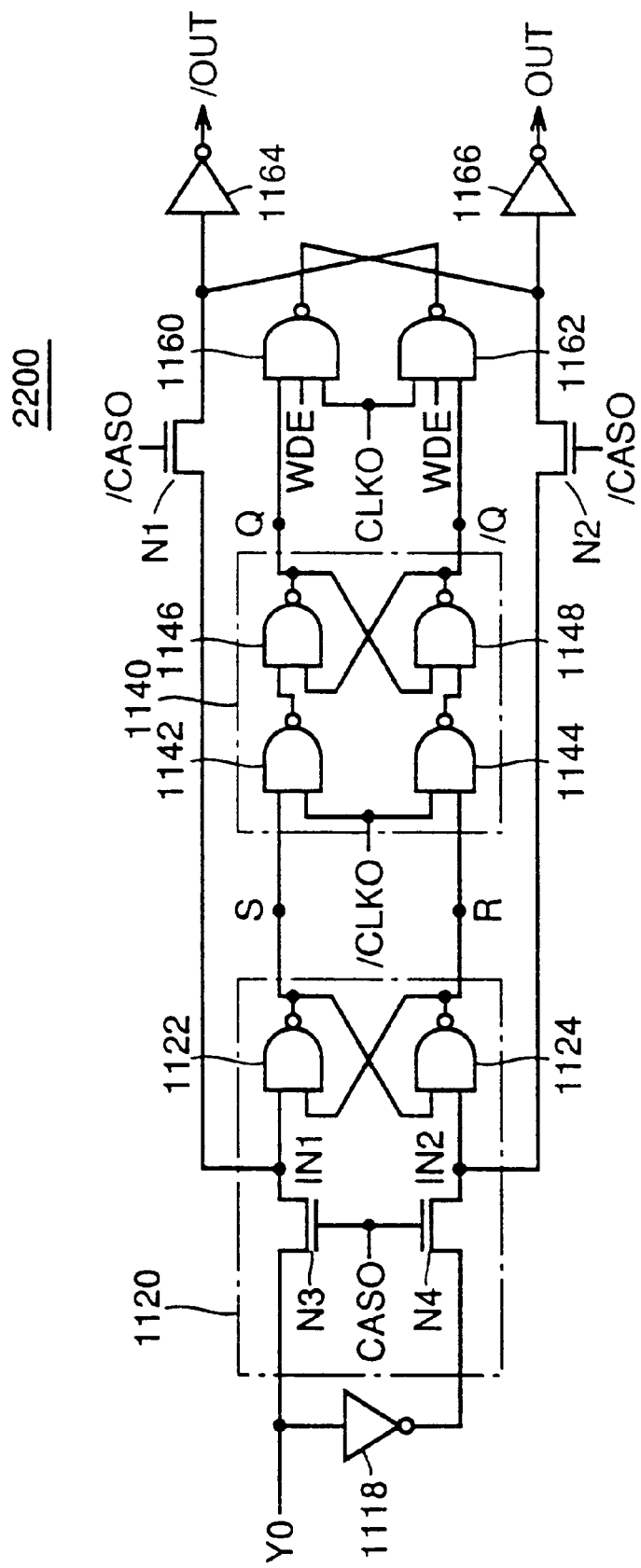
FIG. 23 is a circuit diagram showing a part of a circuit for applying signals φWEQA0 and φWEQA1.

FIG. 23 is a circuit diagram showing the structure of a circuit 2200 for generating signals OUT and /OUT which determine the timing for generating signals φWEQA0 and φWEQA1, comparable to circuit 1100 shown in FIG. 3 in the first embodiment. The structures of circuits 2200 and 1100 differ in that input signals to SR flipflop circuit 1120 are fixed to "H" and "L" levels for nodes IN1 and IN2, respectively, in circuit 1100, and the input signals have the levels inverted in accordance with the value of the least significant bit of the externally applied address signal in circuit 2200.

More specifically, circuit 2200 operates with signals OUT and Reset in circuit 1100 replaced with signals /OUT and OUT, respectively, if the least significant bit Y0 of the address signal is "1". In contrast, if the least significant bit Y0 is "0", signals /OUT and OUT are replaced with each other as compared to the case where the least significant bit Y0 "1".

Figure 24:
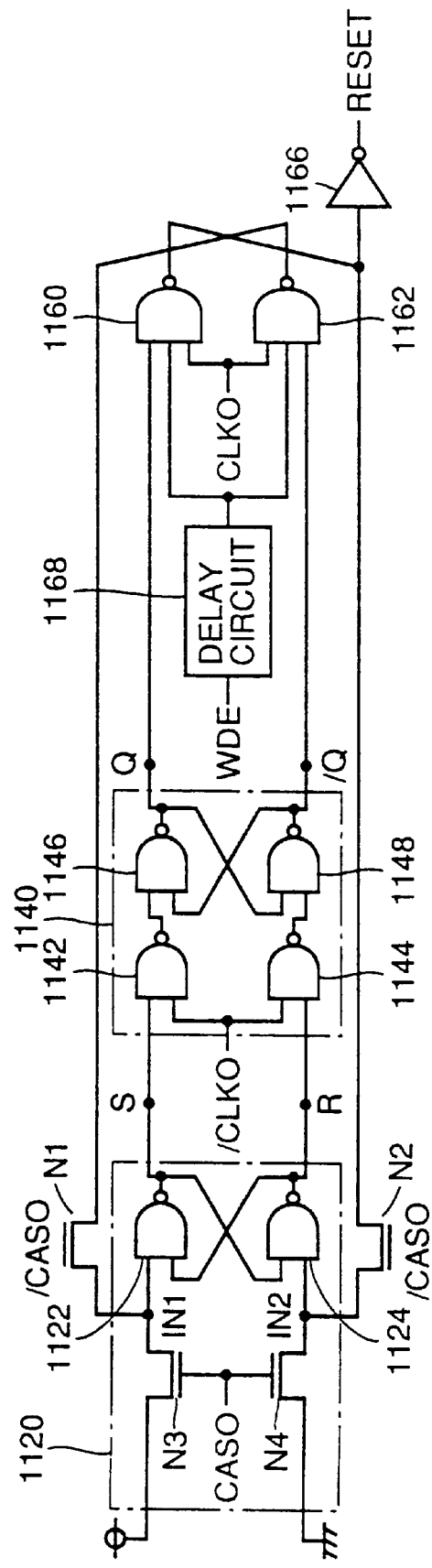
FIG. 24 is a circuit diagram showing another part of the circuit for applying signals φWEQA0 and φWEQA1.

FIG. 24 is a circuit diagran showing the structure of a circuit 2210 for applying another signal Reset which controls the timing for generating signals φWEQA0 and φWEQ01. The structure of this circuit is also basically similar to circuit 1100 shown in FIG. 3. The structure of circuit 2210 is different from that of circuit 1100 in that signal WDE for controlling operation of NAND circuits 1160 and 1162 is input to NAND circuits 1160 and 1162 at a timing delayed by a delay circuit 1168.

Delay circuit 1168 ensures output of signal Reset in the last cycle during 2-bit prefetch operation, as will be described below.

Description below is based on an example where the least significant Y0 of the address signal is at "0" level.

As in the timing chart shown in FIG. 4, 2-bit prefetch operation is initiated in cycle 1. In response to the rising edge of signal CLK0 in cycle 2, signal OUT changes to an "H" level. Signals OUT and /OUT alternately change to an "H" level in each cycle in response to the rising edge of signal CLK0 during the period when signal WDE is at an "H" level.

Signal Reset changes to an "H" level in response to the rising edge of signal CLK0 in cycles 3 and 5, similarly to circuit 1100 shown in FIG. 3.

Next, description will be made of the circuits for receiving signals OUT, /OUT and Reset and applying signals φWEQA0 and φWEQA1.

Figure 26:
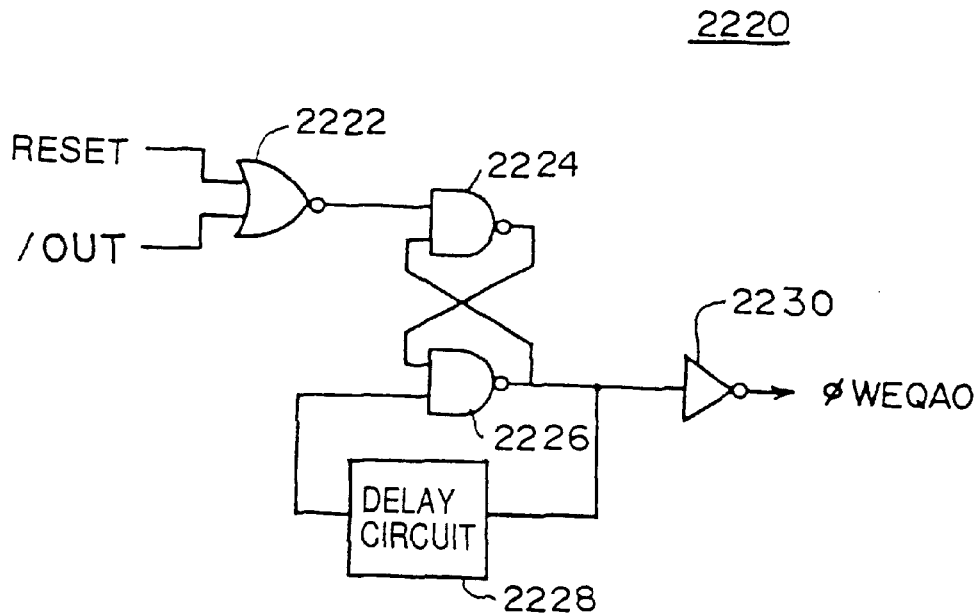
FIG. 26 is a schematic block diagram showing the structure of a circuit 2220 for applying signal φWEQA0.
Figure 27:
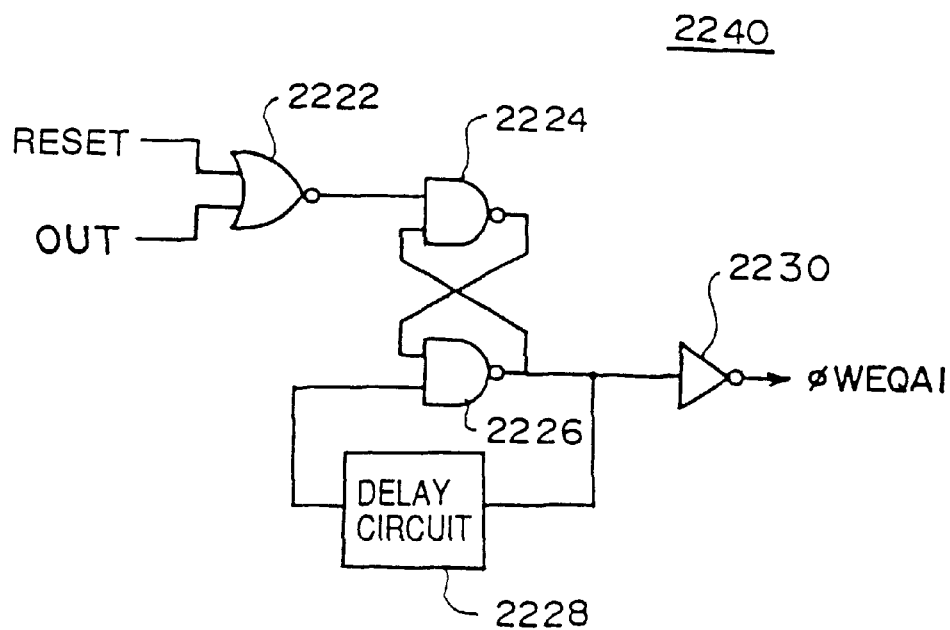
FIG. 27 is a schematic block diagram showing the structure of a circuit 2240 for applying signal φWEQA1.
Figure 28:
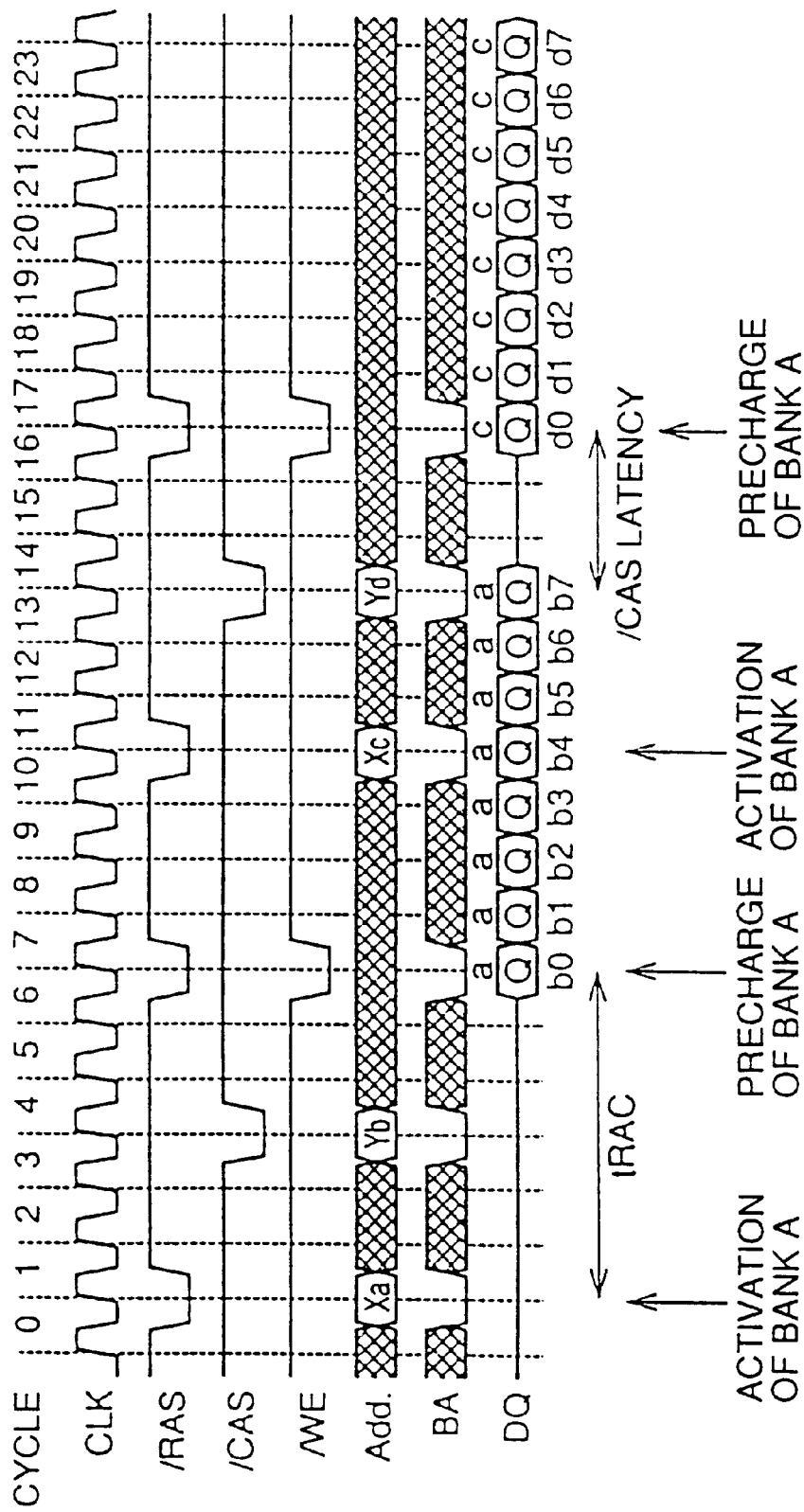
FIGS. 28 and 29 are timing charts showing how external signals change in successive readout and writing operation, respectively, of a conventional SDRAM.
Figure 29:
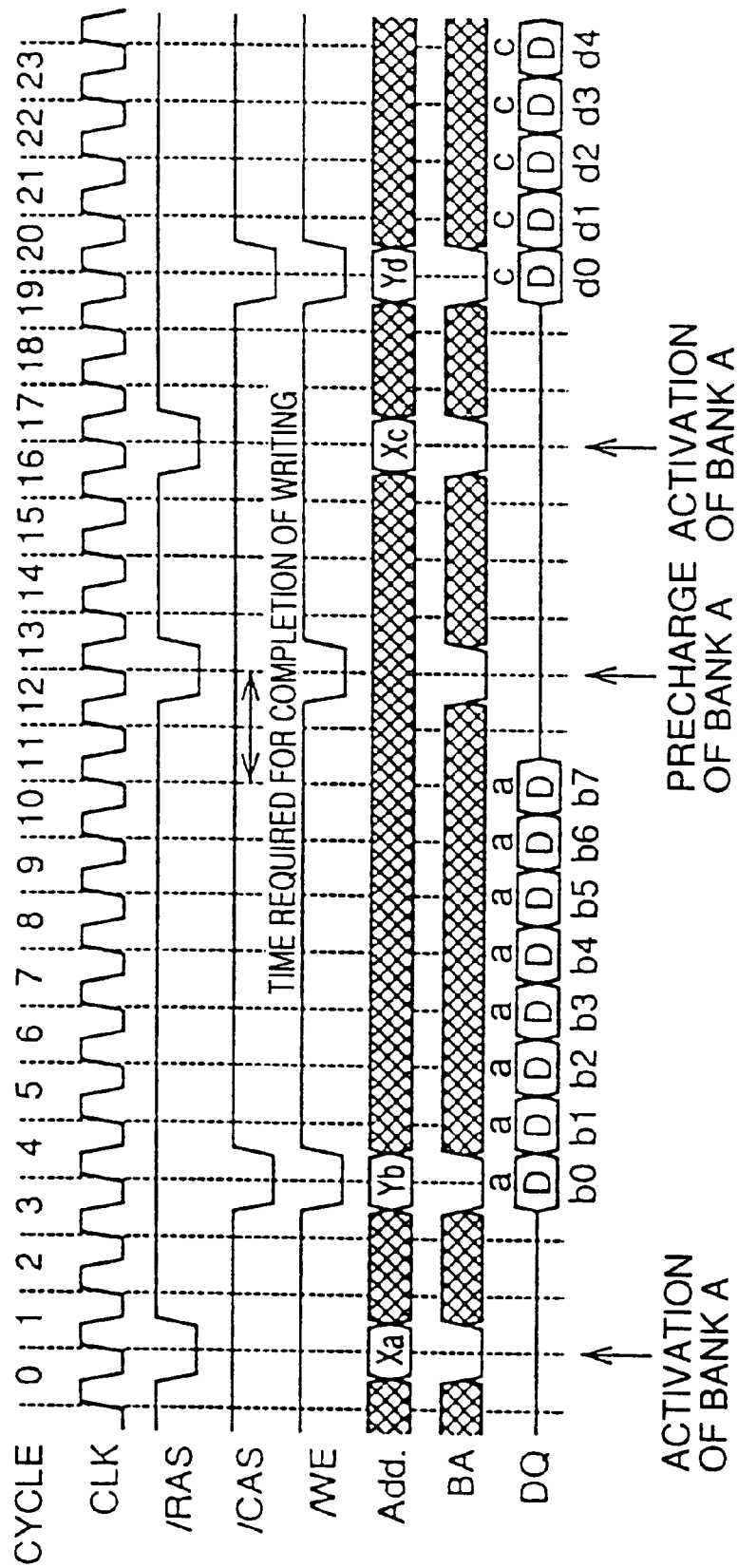
Figure 30:
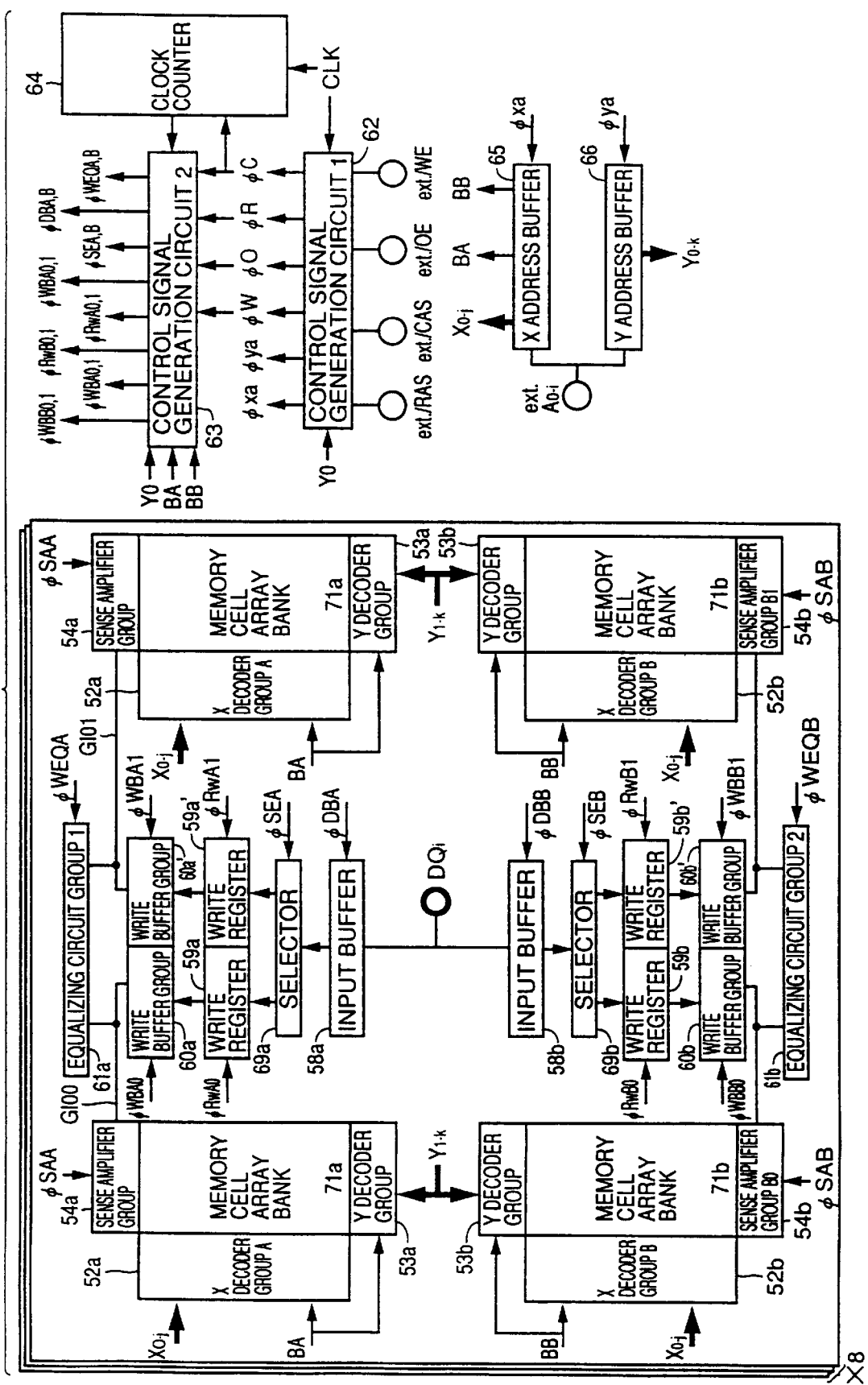
FIG. 30 is a block diagram functionally showing the entire structure of the conventional SDRAM.

FIG. 26 is a schematic block diagram showing the structure of a circuit 2220 for applying signal φWEQA0, and FIG. 27 is a schematic block diagram showing the structure of a circuit 2240 for applying signal φWEQA1.

Circuits 2220 and 2240 are basically similar in structure, and the only difference therebetween lies in the signals they receive for controlling the timing of the signal applied thereby.

Circuit 2220 includes an NOR circuit 2222 for receiving signals Reset and /OUT, an NAND circuit 2224 for receiving an output of NOR circuit 2222 as one input, an NAND circuit 2226 for receiving an output of NAND circuit 2224 as one input and having an output connected to the other input node NAND circuit 2224, a delay circuit 2228 connected between an output node and the other input node of NAND circuit 2226, and an inverter circuit 2230 for receiving the output of NAND circuit 2226 and applying signal φWEQA0.

More specifically, circuit 2220 applies signal φWEQA0 having a prescribed pulse length determined by delay circuit 2228 in repose to one of signals Reset and /OUT attaining an "H" level. The operation thereof will be briefly described below.

When signals Reset and /OUT are both at an "L" level, the output level of NOR circuit 2222 is at an "H" level. At this point in time, the output level of NAND circuit 2224 is at an "L" level and the output level of NAND circuit 2226 is at an "H" level, which is the stable state. Therefore, signal φWEQA0 output from inverter 2230 is at an "H" level. Here, when one of signals Reset and /OUT attains an "H" level, the output level of NOR circuit 2222 changes to an "L" level in response thereto. The output level of NAND circuit 2224 changes to an "H" level and the output level of NAND circuit 2226 attains an "L" level in response thereto. As a result, signal φWEQA0 output from inverter circuit 2230 changes to an "H" level.

Figure 25:
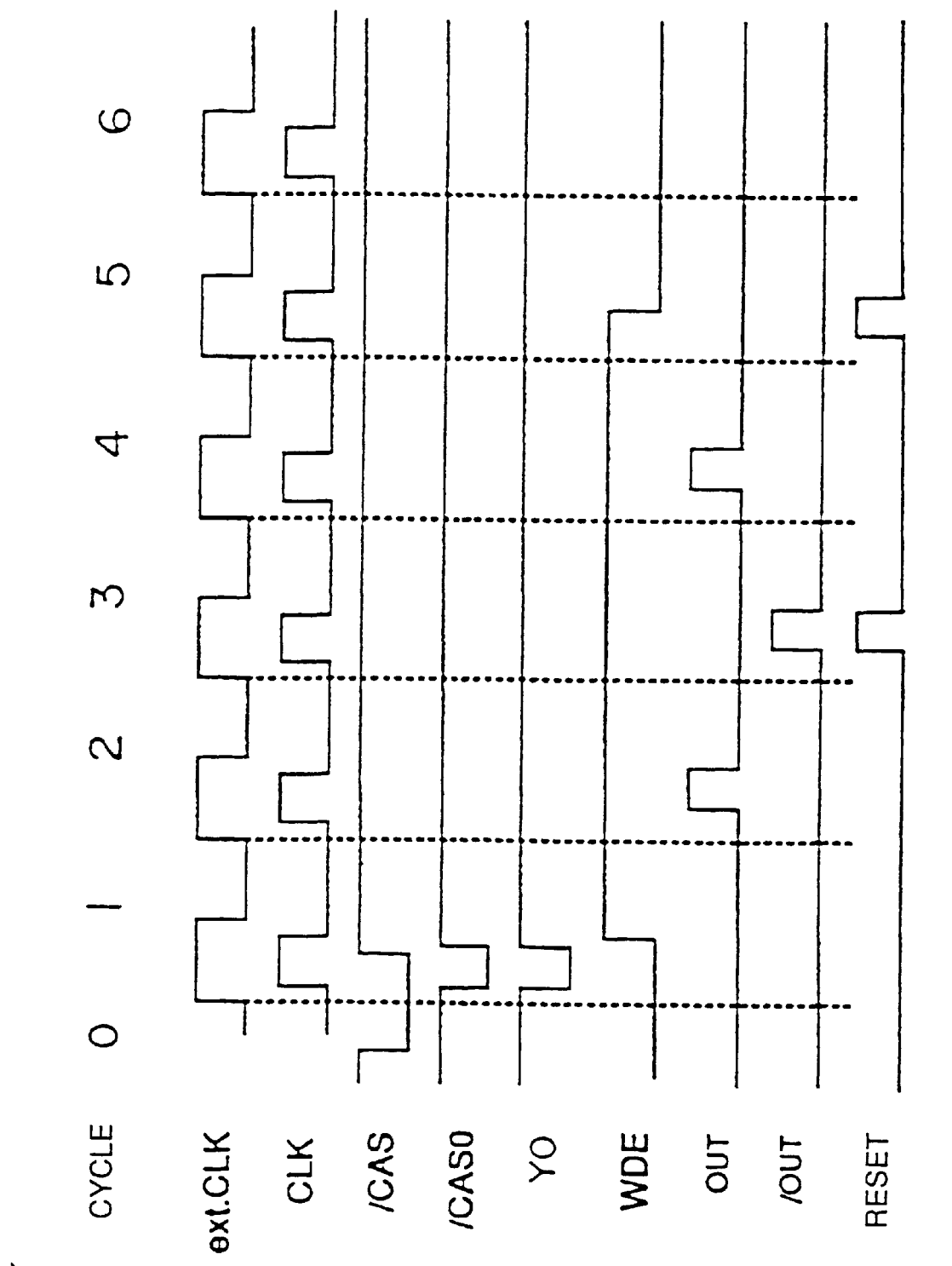
FIG. 25 is a timing chart showing operation of the circuit shown in FIGS. 23 and 24.

After the output level of NAND circuit 2226 attains an "L" level, such change is transmitted through delay circuit 2228 and after a prescribed time period is elapsed one input of NAND circuit 2226 attains an "L" level. Then, output level of NAND circuit 2226 changes again to an "H" level, thereby attaining a stable state. As a result, output signal φWEQA0 of inverter circuit 2230 returns to an "L" level. Therefore, when signals /OUT and Reset change as shown in FIG. 25, signal φWEQA0 changes to an "H" level in cycles 3 and 5 as shown in FIG. 22.

FIG. 27 is a schematic block diagram showing the structure of circuit 2240 for applying signals φWEQA1.

Since the structure of circuit 2240 is similar to circuit 2220 except that signals received by NOR circuit 2222 are signals Reset and OUT, the identical portions are labeled with the identical reference numerals as description thereof will not be repeated.

Therefore, circuit 2230 has its output signal φWEQA1 changed to an activated state (attaining an "H" level) in response to one of signals Reset and OUT attaining an "H" level.

More specifically, when signals OUT and Reset change as shown in FIG. 25, signal φWEQA1 is activated in cycles 2, 3, 4 and 5, exhibiting the change shown in FIG. 22.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device for receiving external signals which include a control signal, an address signal, and a data signal in synchronization with an external clock signal, comprising:

a memory cell array including a plurality of memory cells arranged in rows and columns;

first and second signal input/output line pairs for transmitting the data signal to said memory cell array;

a frequency-dividing circuit for dividing a frequency of said external clock signal and applying an internal clock signal;

a selecting circuit for selecting corresponding memory cells in said memory cell array in accordance with said address signal;

a data input circuit controlled in accordance with said external clock signal for receiving and holding first and second data signals serially input from an exterior of said synchronous semiconductor memory device, wherein said data input circuit is configured to output in parallel said first data signal complementarily to said first signal input/output line pair and second data signal complementarily to said second signal input/output line pair; and a connecting circuit controlled in accordance with said internal clock signal for connecting said first and second signal input/output line pairs with corresponding memory cells selected by said selecting circuit respectively in a cycle of said external clock signal in which said data input circuit has received and output both said first and second data signals.

2. The synchronous semiconductor memory device according to claim 1, further comprising an equalizing circuit for setting the potentials of said first and second signal input/output line pairs to a predetermined potential when said selected memory cells are connected with said first and second signal input/output line pairs by said connecting circuit and writing operation is completed.

3. The synchronous semiconductor memory device according to claim 2, wherein said memory cell array includes a plurality of memory cell columns corresponding to said first signal input/output line pair, and a plurality of memory cell columns corresponding to said second signal input/output line pair.

4. A synchronous semiconductor memory device for receiving external signals which include a control signal, an address signal, and a data signal in synchronization with an external clock signal, comprising:

a plurality of memory cell array blocks, each including a plurality of memory cells arranged in rows and columns, a word line provided corresponding to each row, and a bit line pair provided corresponding to each column;

first and second local signal input/output line pairs provided corresponding to each of said plurality of memory cell array blocks;

first and second global signal input/output line pairs provided common to said plurality of memory cell array blocks;

a selecting circuit for selecting corresponding memory cell columns in a corresponding one of said memory cell array blocks in accordance with said address signal;

a frequency-dividing circuit for dividing a frequency of said external clock signal and outputting an internal clock signal;

first and second write registers controlled in accordance with said external clock signal for receiving and holding said data signal alternately and each applying said received data signal to corresponding one of said first and second global signal input/output line pairs;

a first connecting circuit for connecting said first and second local signal input/output line pairs corresponding to said corresponding one of said memory cell array blocks with said first and second global signal input/output line pairs respectively; and a second connecting circuit controlled in accordance with said internal clock signal for connecting said first and second local signal input/output line pairs corresponding to said corresponding one of said memory cell array blocks with said bit line pairs provided corresponding to said corresponding memory cell columns, in a cycle of said external clock signal in which both said first and second write registers have received said data signals to be applied to said first and second global signal input/output line pairs.

5. A synchronous semiconductor memory device for receiving external signals which include a control signal, an address signal, and a data signal in synchronization with an external clock signal, comprising:

a memory cell array including a plurality of memory cells arranged in rows and columns;

first and second signal input/output line pairs for transmitting the data signals to said memory cell array;

a frequency-dividing circuit for dividing a frequency of said external clock signal and outputting first and second internal clock signals which change alternately to each other;

a selecting circuit for selecting corresponding memory cells in said memory cell array in accordance with said address signal;

a data input circuit controlled in accordance with said external clock signal for receiving and holding first and second data signals serially input from an exterior of said synchronous semiconductor memory device, wherein said data input circuit is configured to output in parallel said first data signal complementarily to said first signal input/output line pair and second data signal complementarily to said second signal input/output line pair;

a first connecting circuit controlled in accordance with said first internal clock signal, for connecting said first signal input/output line pair with the corresponding memory cell selected by said selecting circuit in and after a cycle of said external clock signal in which said data input circuit receives said first data signal; and a second connecting circuit controlled in accordance with said second internal clock signal, for connecting said second signal input/output line pair with the corresponding memory cell selected by said selecting circuit after said cycle.

6. The synchronous semiconductor memory device according to claim 5, further comprising an equalizing circuit for setting the potentials of said first and second signal input/output line pairs to a predetermined potential when said selected memory cells are connected with said first and second signal input/output line pairs by said first and second connecting respectively and writing operation is completed.

7. The synchronous semiconductor memory device according to claim 6, wherein said memory cell array includes a plurality of memory cell columns connected to said first signal input/output line pair by said first connecting circuit, and a plurality of memory cell columns connected to said second signal input/output line pair by said second connecting circuit.

8. A synchronous semiconductor memory device for receiving external signals which include a control signal, an address signal, and a data signal in synchronization with an external clock signal, comprising:

a plurality of memory cell array blocks, each including a plurality of memory cells arranged in rows and columns, a word line provided corresponding to each row, and a bit line pair provided corresponding to each column;

first and second local signal input/output line pairs provided corresponding to each of said plurality of memory cell array blocks;

first and second global signal input/output line pairs provided common to said plurality of memory cell array blocks;

a selecting circuit for selecting corresponding first and second memory cells in corresponding one of said memory cell array blocks in accordance with said address signal;

a frequency-dividing circuit for dividing a frequency of said external clock signal and outputting first and second internal clock signals which change alternately to each other;

first and second write registers controlled in accordance with said external clock signal for receiving and holding said data signal alternately and each applying said received data signal to corresponding one of said first and second global signal input/output line pairs;

a first connecting circuit for connecting said first and second local signal input/output line pairs corresponding to said corresponding one of said memory cell array blocks with said first and second global signal input/output line pairs respectively;

a second connecting circuit controlled in accordance with said first internal clock signal for connecting said first local signal input/output line pair corresponding to said corresponding one of said memory cell array blocks with said bit line pair to which said first memory cell is connected; and a third connecting circuit controlled in accordance with said second internal clock signal for connecting said second local signal input/output line pair corresponding to said corresponding one of said memory cell array blocks with said bit line pair to which said second memory cell is connected.

9. A synchronous semiconductor memory device for receiving external signals which include a control signal, an address signal, and a data signal in synchronization with an external clock signal, comprising:

a memory cell array including a plurality of memory cells arranged in rows and columns;

first and second signal input/output line pairs for transmitting the data signal to said memory cell array;

a selecting circuit for selecting corresponding memory cells in said memory cell array in accordance with said address signal;

a data input circuit controlled in accordance with said external clock signal for receiving and holding first and second data signals serially input from an exterior of said synchronous semiconductor memory device, wherein said data input circuit outputs said first data signal complementarily to said first signal input/output line pair and said second data signal complementarily to said second signal input/output line pair;

a frequency-dividing circuit for dividing a frequency of said external clock signal and outputting an internal clock signal;

an equalizing circuit controlled in accordance with activation of every said external clock signal during a writing operation for equalizing potential levels of said first and second signal input/output line pairs;

a connecting circuit having input node pairs receiving said first and second data signals transmitted through said first and second signal input/output line pairs respectively and having output node pairs each connected to a corresponding one of said input node pairs in accordance with activation of said internal clock signal; and a driving circuit for holding said first and second data signals from said output node pairs of said connecting circuit and outputting said first and second data signals to said corresponding memory cells selected by said selecting circuit respectively.

10. The synchronous semiconductor memory device according to claim 9, wherein said memory cell array includes
a plurality of memory cell columns corresponding to said first signal input/output line pair; and
a plurality of memory cell columns corresponding to said second signal input/output line pair.

11. A synchronous semiconductor memory device for receiving external signals which include a control signal, an address signal, and a data signal in synchronization with an external clock signal, comprising:

a memory cell array including a plurality of memory cells arranged in rows and columns;

first and second signal input/output line pairs for transmitting the data signal to said memory cell array;

a frequency-dividing circuit for dividing a frequency of said external clock signal and outputting an internal clock signal;

a selecting circuit for selecting corresponding memory cells in said memory cell array in accordance with said address signal;

a data input circuit controlled in accordance with said external clock signal for receiving and holding first and second data signals serially input from an exterior of said synchronous semiconductor memory device, wherein said data input circuit is configured to output said first data signal complementarily to said first signal input/output line pair and second data signal complementarily to said second signal input/output line pair; and a connecting circuit having input node pairs receiving said first and second data signals transmitted through said first and second signal input/output line pairs respectively and having output node pairs each connected to a corresponding one of said input node pairs in accordance with activation of said internal clock signal;

a driving circuit for holding said first and second data signals from said output node pairs of said connecting circuit and outputting said first and second data signals to said corresponding memory cells selected by said selecting circuit respectively;

a first equalizing circuit controlled in accordance with said internal clock signal for equalizing potential levels of said first signal input/output line pair when said output node pairs are disconnected from said input node pairs; and a second equalizing circuit controlled in accordance with said external clock signal for equalizing potential levels of said second signal input/output line pair.

12. The synchronous semiconductor memory device according to claim 11, wherein said memory cell array includes
a plurality of memory cell columns corresponding to said first input/output line pair, and
a plurality of memory cell columns corresponding to said second signal input/output line pair.

13. A synchronous semiconductor memory device comprising:

a plurality of memory cells arranged in rows and columns;

a data input circuit in parallel applying first and second data signals serially inputted in response to external clock signal;

a frequency-divider circuit dividing a frequency of said external clock signal and applying an internal clock signal;

first and second data bus pairs transmitting said first and second data signals from said data input circuit respectively;

a plurality of bit line pairs provided corresponding to said columns of memory cells;

a plurality of first transistor pairs each coupled between said first data bus pairs and a corresponding pair among said plurality of bit line pairs;

a plurality of second transistor pairs each coupled between said second data bus pairs and a corresponding pair among said plurality of bit line pairs;

a plurality of column select lines provided corresponding to said plurality of first transistor pairs and said plurality of second transistor pairs; and a column select circuit selecting a column select line among said plurality of column select lines in response to an address signal and said internal clock signal.

14. The synchronous semiconductor memory device according to claim 13, wherein
each of said plurality of column select lines is connected to gates of a corresponding pair among said plurality of first transistor pairs and to gates of a corresponding pair among said plurality of second transistor pairs.

15. The synchronous semiconductor memory device according to claim 14, wherein
said column select circuit selects the column select line among said plurality of column select lines for a first period longer than a second period from a time at which said first data signal is incorporated by said data input circuit to a time at which said second data signal is incorporated by said data input circuit.

16. The synchronous semiconductor memory device according to claim 14, further comprising:

a first equalize circuit in response to an activation signal equalizing potentials of said first data bus pair; and a second equalize circuit in response to the activation signal equalizing potentials of said second data bus pair.

17. The synchronous semiconductor memory device according to claim 13, wherein
said plurality of column select lines are connected to gates of said plurality of first and second transistor pairs respectively.

18. The synchronous semiconductor memory device according to claim 17, further comprising:

a first equalize circuit in response to a first activation signal equalizing potentials of said first data bus pair; and a second equalize circuit in response to a second activation signal equalizing potentials of said second data bus pair.

19. The synchronous semiconductor memory device according to claim 13, wherein
said data input circuit includes
an input buffer serially receiving said first and second data signals,
a first write register incorporating said first data signal,
a second write register incorporating said second data signal, and
a selector receiving said first and second data signals from said input buffer and applying said first and second data signals to said first and second write registers respectively.

20. The synchronous semiconductor memory device according to claim 13, further comprising:

a first write buffer receiving said first data signal from said data input circuit and in response to a first activation signal applying the first data signal to said first data bus pairs; and a second write buffer receiving said second data signal from said data input circuit and in response to a second activation signal applying the second data signal to said second data bus pairs.

21. The synchronous semiconductor memory device according to claim 13, further comprising:

a plurality of word lines provided corresponding to said rows of memory cells, each crossing said plurality of bit line pairs.

* * * * *

UNITED STATES PATENT AND TRADEMARK OFFICE
CERTIFICATE OF CORRECTION

PATENT NO. : 5,946,266
DATED : August 31, 1999
INVENTOR(S) : Hisashi IWAMOTO, et al.

It is certified that error appears in the above-identified patent and that said Letter Patent is hereby corrected as shown below:

Column 26, Claim 6, Line 57, after "connecting", insert --circuits--.

Signed and Sealed this

Third Day of April, 2001

Attest:

NICHOLAS P. GODICI

*Attesting Officer*   *Acting Director of the United States Patent and Trademark Office*